United States Patent
Minato et al.

(10) Patent No.: US 10,992,102 B2
(45) Date of Patent: Apr. 27, 2021

(54) SUBMOUNT, SEMICONDUCTOR DEVICE MOUNTING SUBMOUNT, AND SEMICONDUCTOR DEVICE MODULE

(71) Applicant: FURUKAWA ELECTRIC CO., LTD., Tokyo (JP)

(72) Inventors: Ryuichiro Minato, Tokyo (JP); Yutaka Ohki, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/100,722

(22) Filed: Aug. 10, 2018

(65) Prior Publication Data

US 2019/0006818 A1 Jan. 3, 2019

Related U.S. Application Data

(63) Continuation of application No. PCT/JP2017/005106, filed on Feb. 13, 2017.

(30) Foreign Application Priority Data

Feb. 12, 2016 (JP) .............................. JP2016-025353

(51) Int. Cl.
*H01S 5/022* (2021.01)
*H01S 5/023* (2021.01)
(Continued)

(52) U.S. Cl.
CPC ............ *H01S 5/023* (2021.01); *H01S 5/0233* (2021.01); *H01S 5/0235* (2021.01);
(Continued)

(58) Field of Classification Search
CPC ............ H01S 5/02236; H01S 5/02216; H01S 5/02248; H01S 5/02284; H01S 5/4012;
(Continued)

(56) References Cited

U.S. PATENT DOCUMENTS

| 2004/0102023 A1* | 5/2004 | Morozumi | H01L 23/3735 438/460 |
| 2005/0141575 A1* | 6/2005 | Lorenzen | H01S 5/02264 372/34 |

(Continued)

FOREIGN PATENT DOCUMENTS

| JP | 2006-344743 | 12/2006 |
| JP | 2008-172141 | 7/2008 |

(Continued)

OTHER PUBLICATIONS

International Search Report dated Apr. 11, 2017 in PCT/JP2017/005106, filed on Feb. 13, 2017 (with English Translation).

(Continued)

*Primary Examiner* — Mohammed R Alam
(74) *Attorney, Agent, or Firm* — Oblon, McClelland, Maier & Neustadt, L.L.P.

(57) ABSTRACT

A submount on which a semiconductor device is mounted and which is mounted on a base made of metal, the submount including: a substrate; a first coating layer formed on a first surface of the substrate and made of a material having a higher coefficient of thermal expansion than that of the substrate; and a second coating layer formed on a second (Continued)

surface, positioned on a side opposite to the first surface, of the substrate and made of a material having a higher coefficient of thermal expansion than that of the substrate, in which a coating area of the second coating layer is smaller than a coating area of the first coating layer.

20 Claims, 20 Drawing Sheets

(51) Int. Cl.
*H01S 5/40* (2006.01)
*H01S 5/0233* (2021.01)
*H01S 5/0235* (2021.01)
*H01S 5/02325* (2021.01)
*H01S 5/02216* (2021.01)
*H01S 5/02251* (2021.01)
*H01S 5/30* (2006.01)

(52) U.S. Cl.
CPC ........ *H01S 5/02325* (2021.01); *H01S 5/4012* (2013.01); *H01S 5/02216* (2013.01); *H01S 5/02251* (2021.01); *H01S 5/3013* (2013.01)

(58) Field of Classification Search
CPC .. H01S 5/02272; H01S 5/02476; H01S 5/024; H01S 5/02469; H01S 5/0224; H01S 5/0021; H01S 5/0014; H01S 5/4031; H01S 2301/14; H01L 33/486; H01L 23/4924; H01L 2224/73265; H01L 23/12–15; H01L 23/34–3736
See application file for complete search history.

(56) References Cited

U.S. PATENT DOCUMENTS

| | | | |
|---|---|---|---|
| 2005/0167679 A1* | 8/2005 | Ishii | H01L 23/488 257/79 |
| 2007/0138651 A1* | 6/2007 | Hauenstein | H01L 23/13 257/782 |
| 2013/0279530 A1 | 10/2013 | Kageyama et al. | |
| 2017/0352607 A1* | 12/2017 | Kooriyama | H01L 23/12 |

FOREIGN PATENT DOCUMENTS

| | | |
|---|---|---|
| JP | 2010-278364 | 12/2010 |
| JP | 2012-89585 | 5/2012 |
| JP | 5075165 | 11/2012 |
| JP | 2014-72277 | 4/2014 |
| JP | 2015-176925 | 10/2015 |
| JP | 2017-17297 | 1/2017 |

OTHER PUBLICATIONS

Written Opinion dated Apr. 11, 2017 in PCT/JP2017/005106, filed on Feb. 13, 2017.

* cited by examiner

SUBMOUNT, SEMICONDUCTOR DEVICE MOUNTING SUBMOUNT, AND SEMICONDUCTOR DEVICE MODULE

CROSS-REFERENCE TO RELATED APPLICATION(S)

This application is a continuation of International Application No. PCT/JP2017/005106, filed on Feb. 13, 2017 which claims the benefit of priority of the prior Japanese Patent Application No. 2016-025353, filed on Feb. 12, 2016, the entire contents of which are incorporated herein by reference.

BACKGROUND OF THE INVENTION

1. Field of the Invention

The present disclosure relates to a submount and a semiconductor device mounting submount using the same, and a semiconductor device module.

2. Description of the Related Art

A semiconductor device module has been known which is provided with a semiconductor device, which includes a semiconductor light emitting element such as a laser diode, a semiconductor optical amplifier, or the like, and an optical fiber optically coupled to the semiconductor device. Such a semiconductor device module may be assembled according to the following procedure, for example. First, the semiconductor device is mounted on a submount. At this time, the semiconductor device is mounted onto the submount using solder such as a gold-tin (AuSn) alloy or the like. The submount (semiconductor device mounting submount) on which the semiconductor device has been mounted in this manner is also referred to as a chip-on-submount.

Next, the chip-on-submount is mounted onto a metal package directly or via a metal base using solder such as a tin-bismuth (SnBi) alloy. Further, other optical parts such as a lens are mounted on the package. The semiconductor device and the optical fiber are optically coupled.

When mounting the semiconductor device on the submount by solder-bonding, the submount and the semiconductor device are generally heated to a temperature higher than a melting point of the solder, and the temperature of the submount is lowered to room temperature after completion of the mounting. At this time, thermal stress is applied to the semiconductor device due to a difference in thermal expansion between the semiconductor device and the submount, and thus, characteristics and reliability of the semiconductor device are sometimes affected by the thermal stress. For example, if the stress is excessive, the semiconductor device warps in some cases, which results in deterioration of the characteristics and reliability of the semiconductor device.

In order to reduce such influence of the thermal stress, a technique is disclosed to set thermal expansion of a semiconductor device and thermal expansion of a submount to the same degree. For example, when a main material of the semiconductor device is gallium arsenide (GaAs), a technique of using a copper-tungsten (CuW) alloy having a coefficient of linear expansion close to that of GaAs as a material of a submount is known.

In addition, Japanese Patent No. 5075165 discloses a technique of configuring a submount by coating a front surface and a back surface of a substrate made of aluminum nitride (AlN) with copper (Cu) plating so as to make a coefficient of linear expansion of the submount and a coefficient of linear expansion of a semiconductor device substantially equal to each other.

However, even when the semiconductor device module is configured using the chip-on-submount obtained by utilizing the above-described technique, the semiconductor device may be warped so that the characteristics and reliability of the semiconductor device deteriorate.

The present disclosure has been made in view of the above-described circumstance, and is directed to a submount, which can suppress deterioration of characteristics and reliability of a semiconductor device by reducing warpage of the submount and thermal stress applied to the semiconductor device in the case of configuring a semiconductor device module by mounting the semiconductor device on the submount and a semiconductor device mounting submount using the same, and a semiconductor device module.

SUMMARY OF THE INVENTION

The present disclosure has been made in view of the above and is directed to a submount and a semiconductor device mounting submount using the same, and a semiconductor device module.

According to a first aspect of the present disclosure, there is provided a submount on which a semiconductor device is mounted and which is mounted on a base made of metal. The submount includes a substrate; a first coating layer formed on a first surface of the substrate and made of a material having a higher coefficient of thermal expansion than that of the substrate; and a second coating layer formed on a second surface opposing to the first surface of the substrate and made of a material having a higher coefficient of thermal expansion than that of the substrate, wherein a coating area of the second coating layer is smaller than a coating area of the first coating layer.

According to a second aspect of the present disclosure, there is provided a submount on which a semiconductor device is mounted and which is mounted on a base made of metal. The submount includes a substrate; a first coating layer formed on a first surface of the substrate and made of a material having a higher coefficient of thermal expansion than that of the substrate; and a second coating layer formed on a second surface, positioned on a side opposite to the first surface, of the substrate and made of a material having a higher coefficient of thermal expansion than that of the substrate, wherein a thickness of the second coating layer is smaller than a thickness of the first coating layer.

According to a third aspect of the present disclosure, there is provided a submount on which a semiconductor device is mounted and which is mounted on a base made of metal. The submount includes a substrate; a first coating layer formed on a first surface of the substrate and made of a material having a higher coefficient of thermal expansion than that of the substrate; and a second coating layer formed on a second surface, positioned on a side opposite to the first surface, of the substrate and made of a material having a higher coefficient of thermal expansion than that of the substrate, wherein $CTE_2$ is smaller than $CTE_1$ when a coefficient of thermal expansion of the second coating layer is $CTE_2$ (1/K) and a coefficient of thermal expansion of the first coating layer is $CTE_1$ (1/K).

According to a fourth aspect of the present disclosure, there is provided a submount on which a semiconductor device is mounted and which is mounted on a base made of metal. The submount includes a substrate; a first coating layer formed on a first surface of the substrate and made of a material having a higher coefficient of thermal expansion than that of the substrate; and a second coating layer formed on a second surface, positioned on a side opposite to the first surface, of the substrate and made of a material having a higher coefficient of thermal expansion than that of the substrate, wherein $CTE_1$ and $CTE_2$ are two or more times higher than $CTE_{sub}$ when a coefficient of thermal expansion of the second coating layer is $CTE_2$ (1/K), a coefficient of thermal expansion of the first coating layer is $CTE_1$ (1/K), and a coefficient of thermal expansion of the substrate is $CTE_{sub}$ (1/K), and when a coating area of the first coating layer is $S_1$, a thickness of the first coating layer is $T_1$, a coating area of the second coating layer is $S_2$, and a thickness of the second coating layer is $T_2$, a relationship of $CTE_1 \times S_1 \times T_1 > CTE_2 \times S_2 \times T_2$ is satisfied.

According to a fifth aspect of the present disclosure, there is provided a semiconductor device mounting submount including the submount according to any one of the first to the fourth aspect; and a semiconductor device mounted on either one of the first coating layer and the second coating layer of the submount.

According to a sixth aspect of the present disclosure, there is provided a semiconductor device module including the semiconductor device mounting submount according to the fifth aspect; a package that accommodates the semiconductor device mounting submount; and a base which is made of metal and on which the semiconductor device mounting submount is mounted.

The above and other objects, features, advantages and technical and industrial significance of this disclosure will be better understood by reading the following detailed description of presently preferred embodiments of the disclosure, when considered in connection with the accompanying drawings.

DETAILED DESCRIPTION OF THE PREFERRED EMBODIMENTS

Hereinafter, embodiments of the present disclosure will be described in detail below with reference to the drawings. Incidentally, the disclosure is not limited by the embodiments. In addition, the same or corresponding components will be denoted appropriately by the same reference signs in the respective drawings. Further, it should be noted that the drawings are schematic and relationship among dimensions of the respective components, ratios of the respective components, and the like may differ from those of the actual. Portions having different relationships or ratios among their dimensions among the drawings may also be included.

Even when a semiconductor device module is configured using a chip-on-submount obtained by utilizing the above-described technique, there is a case where warpage occurs in a semiconductor device so that characteristics and reliability of the semiconductor device deteriorate. As having conducted intensive studies to find a cause thereof, the inventors of the present application have found out the following problem. That is, the chip-on-submount obtained by utilizing the above-described technique is designed so as to minimize stress applied to the semiconductor device and deformation of the semiconductor device in the state of being mounted on the submount. Meanwhile, the chip-on-submount is mounted, directly or via a base, on a package of the semiconductor device module in practical use. At this time, when the chip-on-submount is solder-bonded to the metallic base or the metallic package at a high temperature and then the temperature thereof is lowered to room temperature, thermal stress is generated between the base, the package, or both the base and the package and the chip-on-submount. Here, if a coefficient of thermal expansion of the submount is smaller than either one or both of a coefficient of thermal expansion of the base and a coefficient of thermal expansion of the package, thermal stress may be applied so as to cause convexly upward warpage to the semiconductor device when the temperature of the chip-on-submount is lowered to room temperature.

According to embodiments of the present disclosure, warpage of a semiconductor device is suppressed at room temperature after mounting a chip-on-submount, directly or via a base, on a package of a semiconductor device module at a higher temperature. Therefore, thermal stress applied to the semiconductor device can be reduced, thereby to suppress deterioration of characteristics and reliability of the semiconductor device.

First Embodiment

Figure 1A:
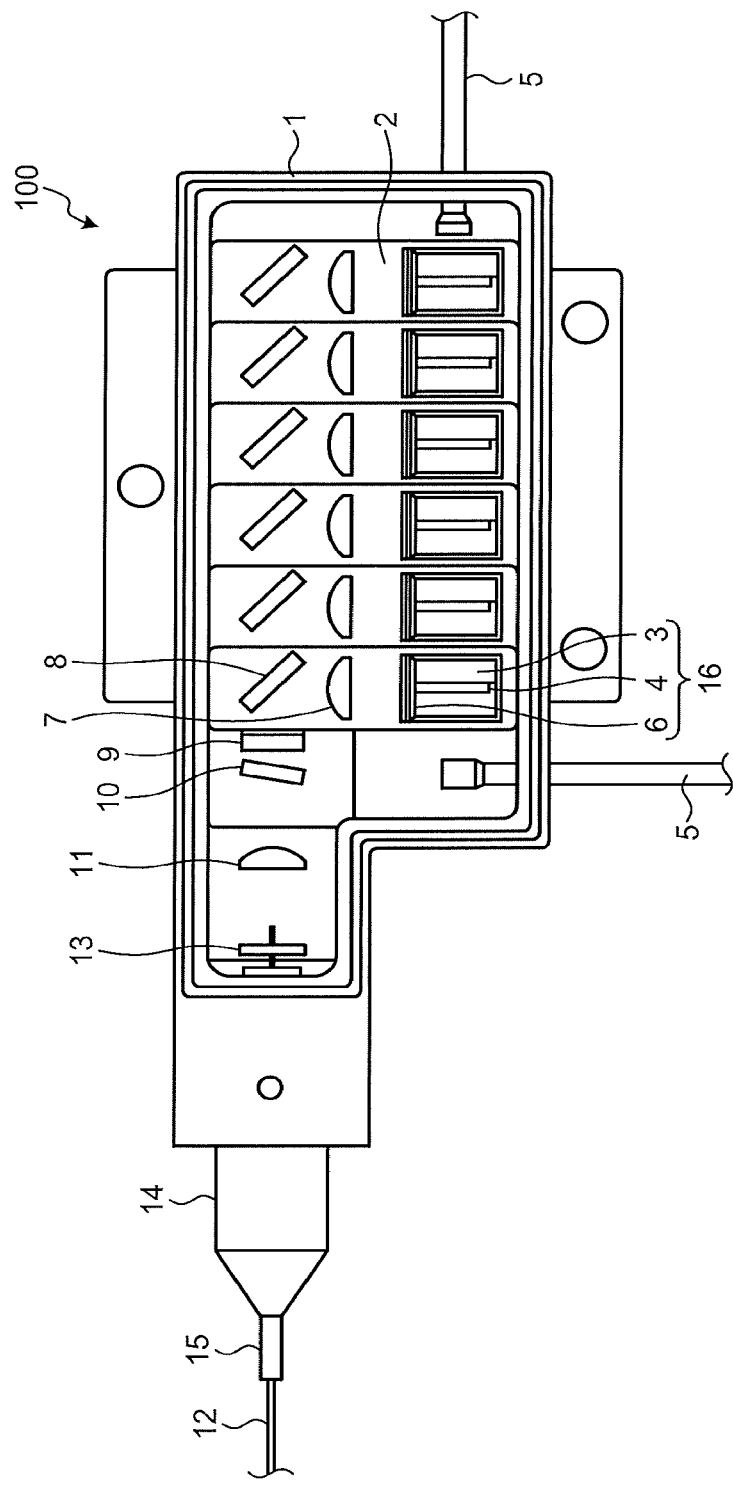
FIG. 1A is a schematic plan view of a semiconductor laser module including a submount according to a first embodiment.
Figure 1B:
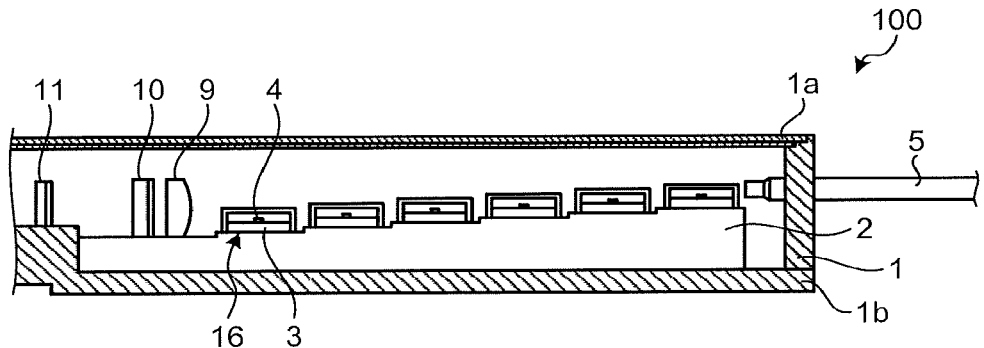
FIG. 1B is a schematic partially-cut side view of the semiconductor laser module including the submount according to the first embodiment.

FIG. 1A is a schematic plan view of a semiconductor laser module including a submount according to a first embodiment. FIG. 1B is a partially-cut side view of the semiconductor laser module.

A semiconductor laser module 100 includes: a package 1 which has a lid 1a and a bottom plate 1b and is made of metal; an LD height adjustment plate 2 serving as a base, which is mounted on the bottom plate 1b, is made of metal, and has a staircase shape; six submounts 3 each of which has a rectangular parallelepiped shape; and six semiconductor laser devices 4 each of which is a semiconductor device having a substantially rectangular parallelepiped shape. Incidentally, the lid 1a is not illustrated in FIG. 1A for the sake of the description. The package 1 and the LD height adjustment plate 2 are made of copper (Cu). A coefficient of linear expansion of Cu is $17 \times 10^{-6}$ (1/K). Incidentally, the package 1 and the LD height adjustment plate 2 may be made of iron (Fe). A coefficient of linear expansion of Fe is $12 \times 10^{-6}$ (1/K). Although not particularly limited, a thickness of the bottom plate 1b is, for example, about 1 to 5 mm, and a thickness of the LD height adjustment plate 2 is, for example, about 1 to 10 mm.

In addition, the semiconductor laser module 100 is provided with two lead pins 5 that are electrically connected to each of the semiconductor laser devices 4 via the submount 3 and a bonding wire (not illustrated), thereby to supply power to each of the semiconductor laser devices 4. Further, the semiconductor laser module 100 includes six first lenses 6, six second lenses 7, six mirrors 8, a third lens 9, an optical filter 10, and a fourth lens 11. When attention is paid to any one of the semiconductor laser devices 4, the first lenses 6, the second lenses 7, the mirrors 8, the third lens 9, the optical filter 10, and the fourth lens 11 are arranged in this order along an optical path of a laser beam output from the semiconductor laser device 4. Further, the semiconductor laser module 100 includes an optical fiber 12 arranged to oppose the fourth lens 11. A proximal end of the optical fiber 12 is accommodated inside the package 1 and supported by a support member 13. The laser beam is incident onto the end facet of the optical fiber 12.

Each of the semiconductor laser devices 4 is configured of, for example, gallium arsenide (GaAs) or indium phosphide (InP) as a main material, and outputs the laser beam having a wavelength depending on the material and a composition thereof. Incidentally, a coefficient of linear expansion of GaAs is $5.9 \times 10^{-6}$ (1/K), and a coefficient of linear expansion of InP is $4.5 \times 10^{-6}$ (1/K). A thickness of each of the semiconductor laser devices 4 is, for example, about 0.1 mm. As illustrated in FIG. 1B, the semiconductor laser devices 4 are mounted on the corresponding ones of the submounts 3. The submounts 3 are mounted on the LD height adjustment plate 2 so as to have different heights from each other. Further, the first lenses 6, the second lenses 7, and the mirrors 8 are arranged at the same heights as the corresponding semiconductor laser devices 4. Here, the submount 3 and the semiconductor laser device 4 mounted on the submount 3 constitute a chip-on-submount 16 serving as a semiconductor device mounting submount.

In addition, a loose tube 15 is provided at an insertion portion of the optical fiber 12, which is inserted into the package 1, and a boot 14 is externally fitted to a part of the package 1 so as to cover a part of the loose tube 15 and the insertion portion.

The semiconductor laser module 100 works in the following manner. The semiconductor laser devices 4 are supplied with power through the lead pin 5 and output laser beams. The laser beams output from the corresponding semiconductor laser devices 4 are converted into substantially collimated beams by the corresponding first lenses 6 and the corresponding second lenses 7, and are reflected by the corresponding mirrors 8 toward the third lens 9. Further, the laser beams are converged by the third lens 9 and the fourth lens 11, and the converged beams are incident on the end facet of the optical fiber 12 and propagate through the optical fiber 12. Incidentally, the optical filter 10 is a band-pass filter configured to prevent light from being input to the semiconductor laser devices 4 when the light having a wavelength different from the wavelength of the laser beam is input to the semiconductor laser module 100 via the optical fiber 12 from the outside.

The semiconductor laser module 100 is assembled, for example, in the following procedure. First, the submount 3 is heated to a bonding temperature of about 300° C., and the semiconductor laser device 4 is mounted onto the submount 3 using AuSn solder having a melting point of about 280° C. This procedure is repeated five more times and thus the six chip-on-submounts 16 are obtained. Next, the bottom plate 1b of the package 1 on which the LD height adjustment plate 2 has been mounted is heated to a bonding temperature of about 150° C., and each of the chip-on-submounts 16 is mounted onto the LD height adjustment plate 2 using SnBi solder having a melting point of about 140° C. Thereafter, other components of the semiconductor laser module 100 are attached to the package 1.

Figure 2A:
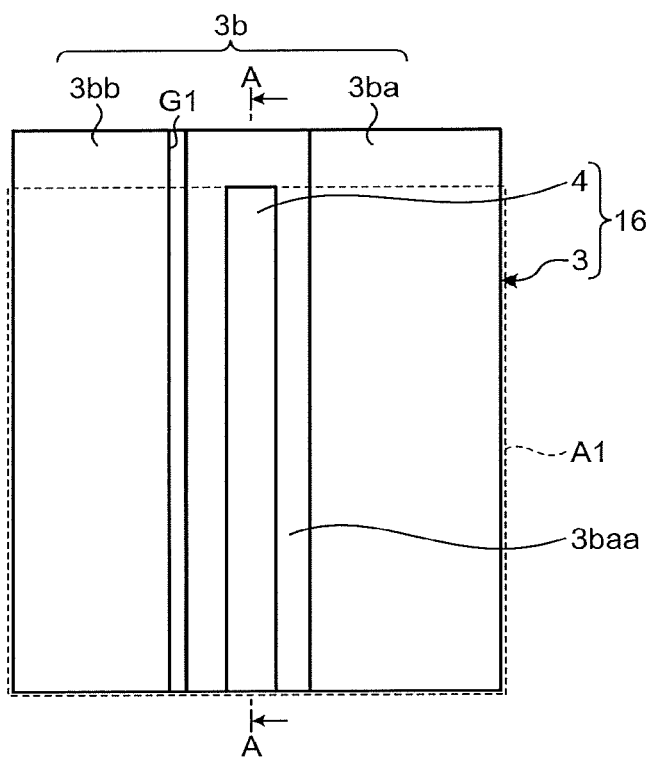
FIG. 2A is a schematic view of a chip-on-submount illustrated in FIGS. 1A and 1B.
Figure 2B:
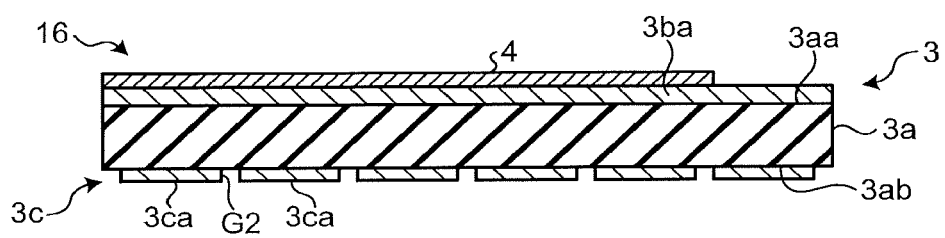
FIG. 2B is a schematic view of the chip-on-submount illustrated in FIGS. 1A and 1B.
Figure 2C:
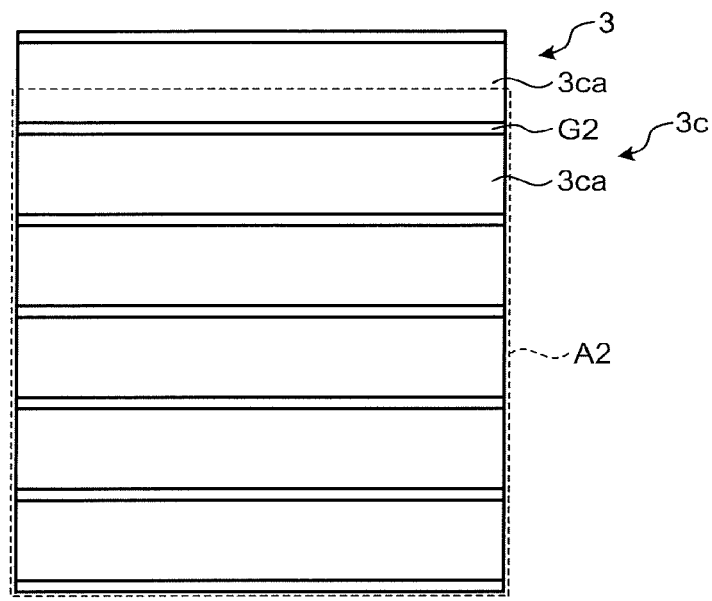
FIG. 2C is a schematic view of the chip-on-submount illustrated in FIGS. 1A and 1B.

Next, the chip-on-submount 16 will be described. FIGS. 2A, 2B, and 2C are schematic views of the chip-on-submount 16. FIG. 2A is a view seen from a mounting surface side of the semiconductor laser device 4, FIG. 2B is a cross-sectional view taken along line A-A of FIG. 2A, and FIG. 2C is a view seen from a side opposite to the mounting surface of the semiconductor laser device 4.

As described above, the chip-on-submount 16 includes the submount 3 and the semiconductor laser device 4 mounted on the submount 3.

The submount 3 includes a substrate 3a, a first coating layer 3b, and a second coating layer 3c. For example, the substrate 3a can be configured to contain at least one of aluminum nitride (AlN), alumina ($Al_2O_3$), beryllia (BeO), boron nitride (BN), diamond, silicon carbide (SiC), silicon nitride ($Si_3N_4$), silicon dioxide ($SiO_2$), and zirconia ($ZrO_2$). In the first embodiment, the substrate 3a is made of AlN. In addition, a thickness of the substrate 3a is, for example, about 0.3 to 1.0 mm. Incidentally, coefficients of linear expansion of AlN, $Si_3N_4$, and SiC are $4.5 \times 10^{-6}$ (1/K), $2.8 \times 10^{-6}$ (1/K), and $3.7 \times 10^{-6}$ (1/K), respectively.

The first coating layer 3b has a thickness in a range of 20 μm to 200 μm, and is formed on a first surface 3aa of the substrate 3a. The first surface 3aa is a surface on the side where the semiconductor laser device 4 is mounted in the first embodiment. The first coating layer 3b is formed of a coating layer 3ba and a coating layer 3bb. Both the coating layer 3ba and the coating layer 3bb are made of a metal multilayer film having Cu as a main component. As described above, the coefficient of linear expansion of AlN, which is the constituent material of the substrate 3a, is $4.5 \times 10^{-6}$ (1/K), and the first coating layer 3b is made of a material having a higher coefficient of linear expansion than that of the substrate 3a.

In addition, the coating layer 3ba and the coating layer 3bb are separated by a groove G1. The groove G1 is provided to electrically insulate the coating layer 3ba from the coating layer 3bb. As will be described later, the coating layer 3bb is electrically connected to an upper surface of the semiconductor laser device 4 via a bonding wire (not illustrated). One side of the lead pin 5 is electrically connected to the coating layer 3ba via a bonding wire (not illustrated), and the other side of the lead pin 5 is electrically connected to the coating layer 3bb via a bonding wire (not illustrated).

The semiconductor laser device 4 is mounted onto the submount 3 using AuSn solder via the coating layer 3ba. A precoat 3baa made of AuSn is formed on a surface of the coating layer 3ba, and accordingly, facilitates the semiconductor laser device 4 to be mounted onto the coating layer 3ba with the AuSn solder. In addition, the semiconductor laser device 4 is mounted in an area A1 in the first coating layer 3b. The area A1 will be described in detail later.

An n-electrode is formed on one surface of the semiconductor laser device 4 (the surface to be bonded to the coating layer 3ba). On the other hand, a p-electrode is formed on the other surface of the semiconductor laser device 4, and the p-electrode is electrically connected to the coating layer 3bb via a bonding wire (not illustrated). As a result, power is supplied from the lead pin 5 to the semiconductor laser device 4 via the n-electrode and the p-electrode. Incidentally, the surface of the semiconductor laser device 4 on the side where the p-electrode is formed may be bonded to the coating layer 3ba.

The second coating layer 3c has a thickness in a range of 20 μm to 200 μm, has the same thickness as the first coating layer 3b, and is formed on a second surface 3ab of the substrate 3a. The second surface 3ab is a surface positioned on a side opposite to the first surface 3aa. The second coating layer 3c is formed of six coating layers 3ca. Each of the coating layers 3*ca* is made of a metal multilayer film containing Cu as a main component, which is the same as the first coating layer 3*b*. Therefore, the second coating layer 3*c* is made of a material having a coefficient of linear expansion larger than that of the substrate 3*a*. In addition, each of the coating layers 3*ca* is separated from an adjacent one of the coating layers 3*ca* by a corresponding one of grooves G2. Here, each of the coating layers 3*ca* is a rectangular layer having a long side stretching in a direction orthogonal to a longitudinal direction of the semiconductor laser device 4 when seen from a direction of the second surface 3*ab* side of the submount 3, and each of the grooves G2 stretches along the direction orthogonal to the longitudinal direction of the semiconductor laser device 4. As a result, the second coating layer 3*c* is formed in a striped pattern. In addition, the second coating layer 3*c* is not formed in an area of the groove G2 on the second surface 3*ab*. Here, the area A1 is defined by a length of the semiconductor laser device 4 in a direction of a resonator (the longitudinal direction of the semiconductor device 4) and a width of the submount 3 (in a direction orthogonal to the resonator direction) in the first coating layer 3*b*. In addition, an area A2 obtained by projecting the area A1 on the second coating layer 3*c* is defined.

Here, a coating area of the second coating layer 3*c* in the area A2 is smaller than a coating area of the first coating layer 3*b* in the area A1 in the submount 3. As a result, thermal stress applied to the semiconductor laser device 4 is reduced, and it is possible to suppress deterioration of characteristics and reliability of the semiconductor laser device 4.

Figure 3A:
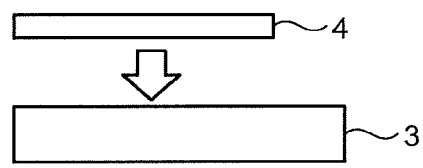
FIG. 3A is a view for describing warpage of a semiconductor laser device in an assembly process of the semiconductor laser module illustrated in FIGS. 1A and 1B.
Figure 3B:
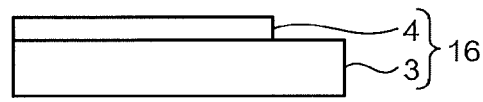
FIG. 3B is a view for describing warpage of the semiconductor laser device in the assembly process of the semiconductor laser module illustrated in FIGS. 1A and 1B.
Figure 3C:
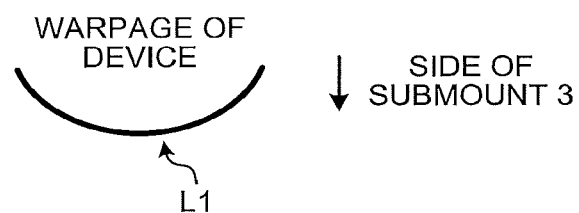
FIG. 3C is a view for describing warpage of the semiconductor laser device in the assembly process of the semiconductor laser module illustrated in FIGS. 1A and 1B.

Hereinafter, detailed descriptions will be given. FIGS. 3A to 3F are views for describing warpage of the semiconductor laser device 4 in an assembly process of the semiconductor laser module 100. As described above, when the semiconductor laser module 100 is assembled, the submount 3 is heated to the bonding temperature of about 300° C., and the semiconductor laser device 4 is mounted onto the first coating layer 3*b* of the first surface 3*aa* of the submount 3 using the AuSn solder having the melting point of about 280° C. as illustrated in the side view of FIG. 3A. Thus, the chip-on-submount 16 is formed as illustrated in FIG. 3B. When the temperature of the chip-on-submount 16 is lowered to room temperature, the chip-on-submount 16 is warped downward into an arc shape as indicated by a line L1 in FIG. 3C. A reason thereof may be explained as follows. That is, the coating area of the second coating layer 3*c* in the area A2 is smaller than the coating area of the first coating layer 3*b* in the area A1 in the submount 3. Thus, when the temperature is lowered from the bonding temperature to room temperature, the first coating layer 3*b* contracts inwards along the longitudinal direction (the lateral direction of the paper) to a greater degree than the second coating layer 3*c*. With this, the first coating layer 3*b* applies thermal stress on the submount 3, with a larger degree than that of the second coating layer 3*c*. Therefore, the entire submount 3 is warped downward. In other words, a middle of the submount 3 is bulged in a direction from the semiconductor laser device 4 to the submount 3. Accordingly, the semiconductor laser device 4 also is warped convexly toward the submount 3.

Figure 3D:
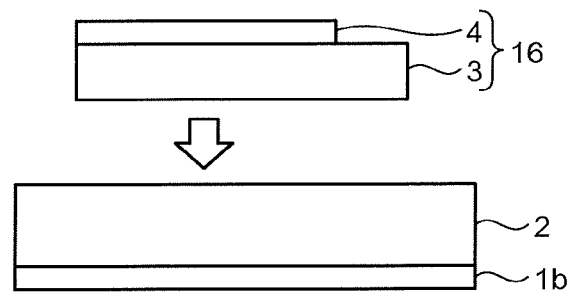
FIG. 3D is a view for describing warpage of the semiconductor laser device in the assembly process of the semiconductor laser module illustrated in FIGS. 1A and 1B.
Figure 3E:
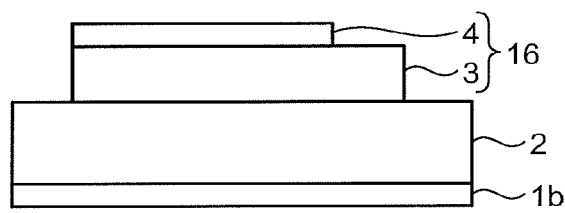
FIG. 3E is a view for describing warpage of the semiconductor laser device in the assembly process of the semiconductor laser module illustrated in FIGS. 1A and 1B.
Figure 3F:
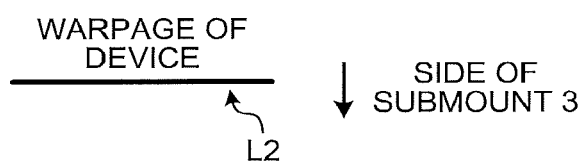
FIG. 3F is a view for describing warpage of the semiconductor laser device in the assembly process of the semiconductor laser module illustrated in FIGS. 1A and 1B.

Next, the bottom plate 1*b* of the package 1 on which the LD height adjustment plate 2 has been mounted is heated to a bonding temperature of about 150° C. Then, each of the chip-on-submounts 16 is mounted onto the LD height adjustment plate 2 at the bonding temperature using the SnBi solder having the melting point of about 140° C., as illustrated in FIG. 3D. The resultant structure is illustrated in FIG. 3E. When the temperature of the bottom plate 1*b* of the package 1 is lowered to room temperature, the warpage of the semiconductor laser device 4 is substantially eliminated as indicated by a line L2 in FIG. 3F. A reason thereof may be explained as follows. That is, since the substrate 3*a* of the submount 3 has the smaller coefficient of thermal expansion than those of the LD height adjustment plate 2 and the bottom plate 1*b* of the package 1, the LD height adjustment plate 2 and the bottom plate 1*b* of the package 1 contract inward along the longitudinal direction to a greater degree than the submount 3 when the temperature is lowered from the bonding temperature to room temperature. With this, thermal stress is applied to the submount 3 so that the submount 3 and the semiconductor laser device 4 are warped in the opposite direction. Therefore, the warpage of the submount 3 convexly toward the side opposite to the semiconductor laser device 4 in the state of FIG. 3B is reduced or canceled, and the warpage of the semiconductor laser device 4 is substantially eliminated.

Incidentally, each coating area of the second coating layer 3*c* and the first coating layer 3*b* and each thickness of the second coating layer 3*c* and the first coating layer 3*b* may be set such that the warpage of the semiconductor laser device 4 is substantially eliminated in consideration of the bonding temperature in each mounting process, the constituent material of the semiconductor laser device 4, the constituent material of the submount 3, each coefficient of thermal expansion and each thickness of the LD height adjustment plate 2 and the bottom plate 1*b* of the package 1, and the like.

Figure 4A:
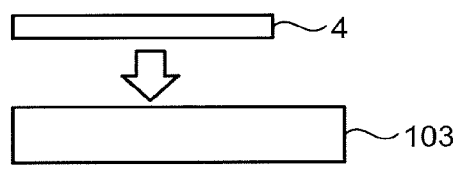
FIG. 4A is a view for describing warpage of a semiconductor laser device in an assembly process of a known semiconductor laser module.
Figure 4B:
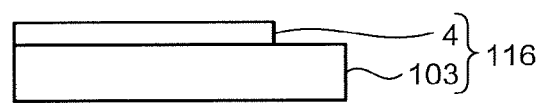
FIG. 4B is a view for describing warpage of the semiconductor laser device in the assembly process of the known semiconductor laser module.
Figure 4C:
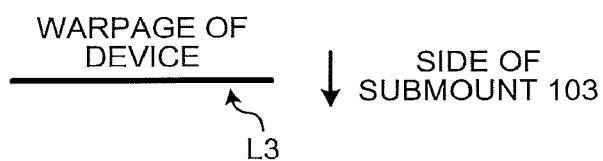
FIG. 4C is a view for describing warpage of the semiconductor laser device in the assembly process of the known semiconductor laser module.

Incidentally, FIGS. 4A to 4F are views for describing the warpage of the semiconductor laser device 4 applied to a known semiconductor laser module. Even in the assembly process of the known semiconductor laser module, a submount 103 is first heated to a bonding temperature of about 300° C. Then, the semiconductor laser device 4 is mounted onto a first coating layer of a first surface of the submount 103 at the temperature, using AuSn solder having a melting point of about 280° C. as illustrated in FIG. 4A. With this, a chip-on-submount 116 is obtained as illustrated in FIG. 4B. At this time, the submount 103 is designed such that there is substantially no warpage of the semiconductor laser device 4 in the longitudinal direction as indicated by a line L3 when temperature of the chip-on-submount 116 is lowered to room temperature as illustrated in FIG. 4C. For example, coating areas and thicknesses of the first coating layer and a second coating layer are designed to be substantially equal to each other.

Figure 4D:
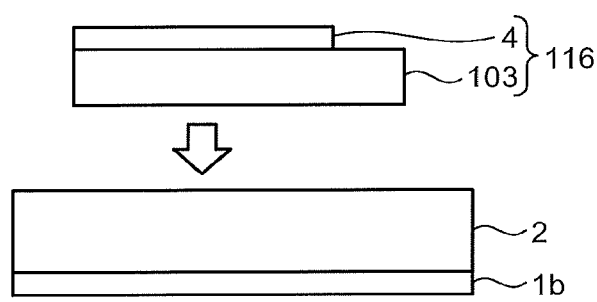
FIG. 4D is a view for describing warpage of the semiconductor laser device in the assembly process of the known semiconductor laser module.
Figure 4E:
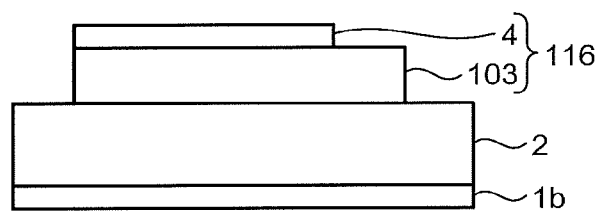
FIG. 4E is a view for describing warpage of the semiconductor laser device in the assembly process of the known semiconductor laser module.
Figure 4F:
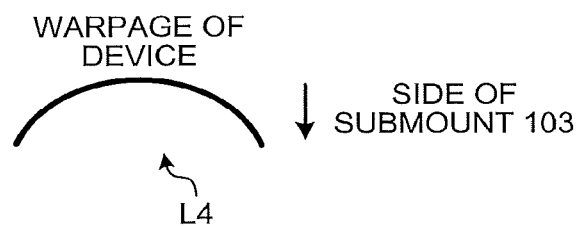
FIG. 4F is a view for describing warpage of the semiconductor laser device in the assembly process of the known semiconductor laser module.

Next, the bottom plate 1*b* of the package 1 on which the LD height adjustment plate 2 has been mounted is heated to a bonding temperature of about 150° C. Then, each of the chip-on-submounts 116 is mounted onto the LD height adjustment plate 2 at the temperature, using the SnBi solder having the melting point of about 140° C. as illustrated in FIG. 4D. The resultant structure is illustrated in FIG. 4E. In this case, however, when the temperature of the bottom plate 1*b* of the package 1 is lowered to room temperature, the semiconductor laser device 4 warps convexly to a side opposite to the submount 103 as indicated by a line L4 in FIG. 4F so that characteristics and reliability thereof deteriorate.

As described above, in the semiconductor laser module 100 provided with the submount 3 according to the first embodiment, the deterioration in characteristics and reliability of the semiconductor laser device 4 is suppressed.

Modifications

Figure 5A:
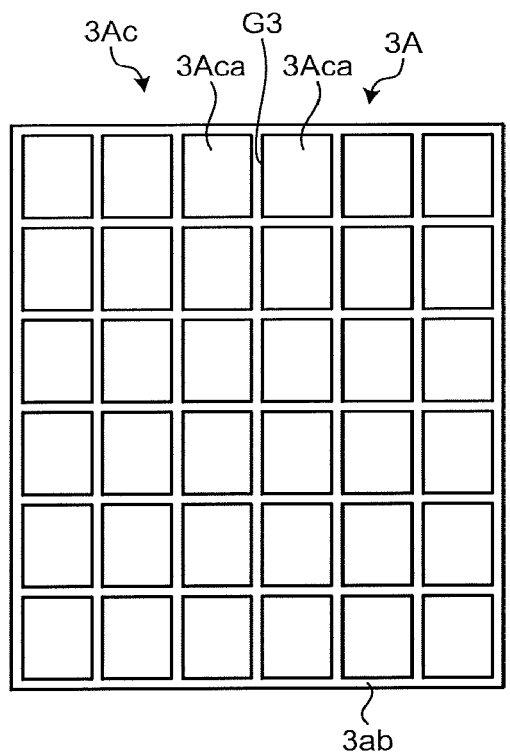
FIG. 5A is a schematic view of a submount according to a first modification of the first embodiment.
Figure 5B:
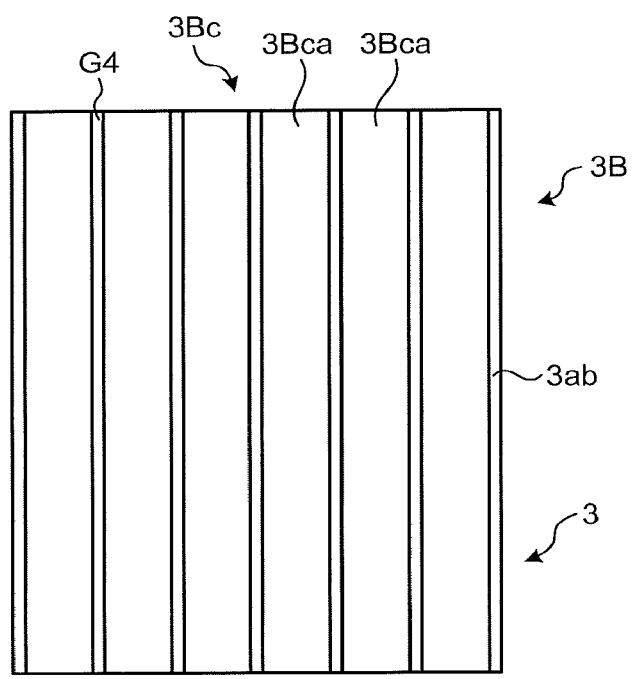
FIG. 5B is a schematic view of a submount according to a second modification of the first embodiment.
Figure 5C:
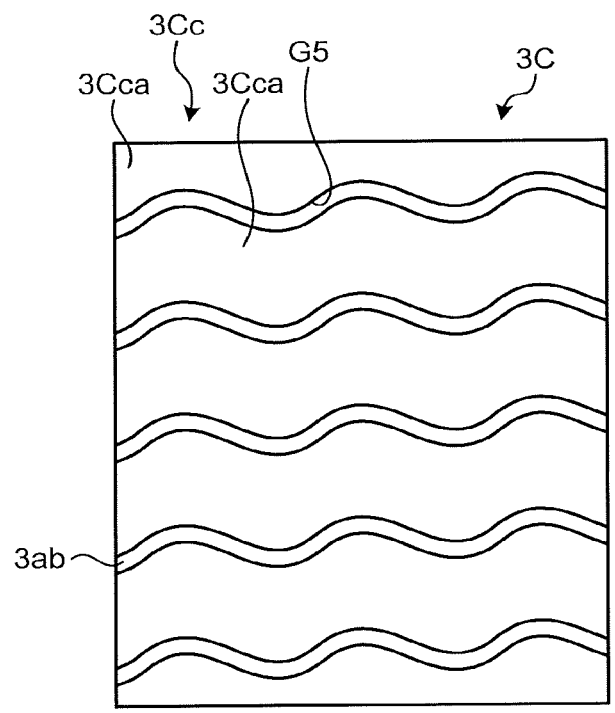
FIG. 5C is a schematic view of a submount according to a third modification of the first embodiment.
Figure 5D:
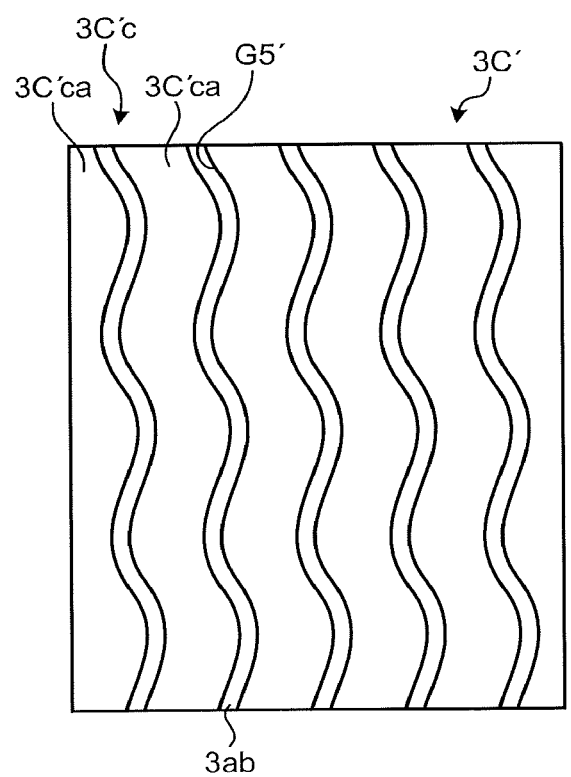
FIG. 5D is a schematic view of a submount according to a further modification of the third modification of the first embodiment.
Figure 6A:
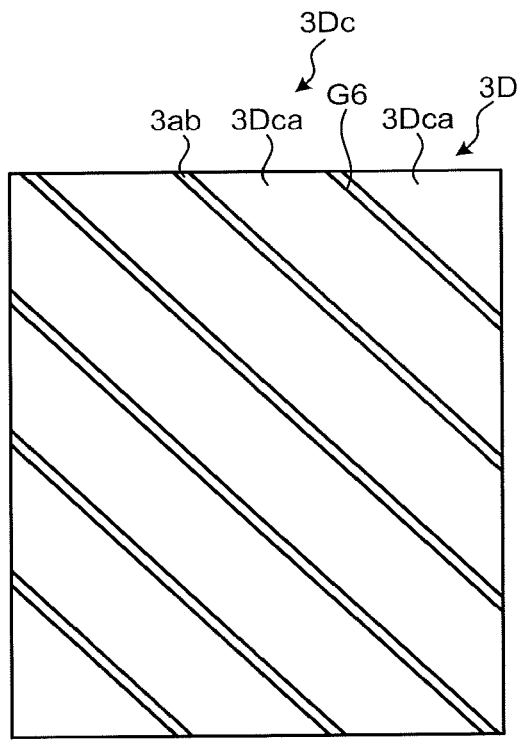
FIG. 6A is a schematic view of a submount according to a fourth modification of the first embodiment.
Figure 6B:
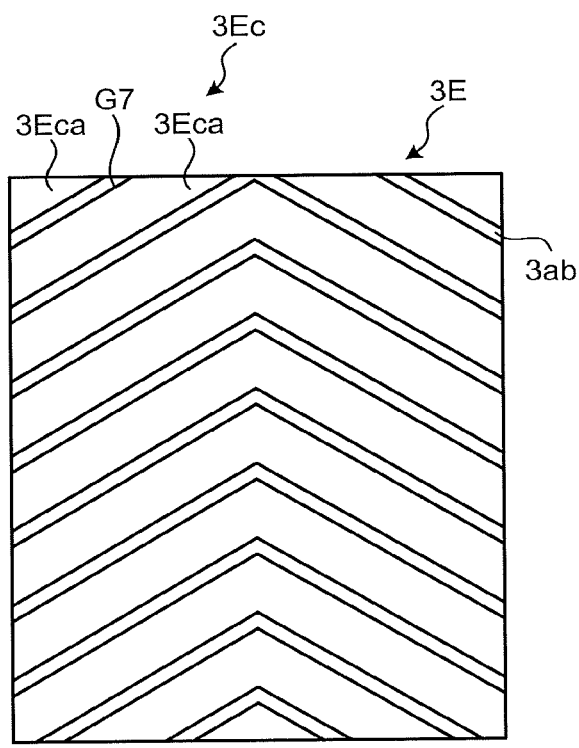
FIG. 6B is a schematic view of a submount according to a fifth modification of the first embodiment.

Next, submounts according to second to sixth modifications, which can replace the submount 3 according to the first embodiment in the chip-on-submount 16 and the semiconductor laser module 100, will be described with reference to FIGS. 5A to 5D, and FIGS. 6A and 6B. FIG. 5A is a view of a submount 3A according to the second modification as seen from a second surface side. FIG. 5B is a view of a submount 3B according to the third modification as seen from a second surface side. FIG. 5C is a view of a submount 3C according to the fourth modification as seen from a second surface side. FIG. 5D is a view of a submount 3C' according to a further modified example of the fourth modification as seen from a second surface side. FIG. 6A is a view of a submount 3D according to the fifth modification as seen from a second surface side, and FIG. 6B is a view of a submount 3E according to the sixth modification as seen from a second surface side. Since only a pattern of the second coating layer and the coating area thereof are different in each of the submounts 3A, 3B, 3C, 3C', 3D, and 3E from in the submount 3, only the pattern and coating area of the second coating layer will be described hereinafter.

Referring to FIG. 5A, the submount 3A has a second coating layer 3Ac formed on the second surface 3ab of the substrate 3a. The second coating layer 3C has a thickness in a range of 20 μm to 200 μm and has the same thickness as the first coating layer 3b. The second coating layer 3Ac is formed of 36 coating layers 3Aca. Each of the coating layers 3Aca is made of a metal multilayer film containing Cu as a main component, which is the same as the first coating layer 3b. In addition, each of the coating layers 3Aca is separated from an adjacent one of the adjacent coating layers 3Aca by a corresponding one of grooves G3. As a result, the second coating layer 3Ac is formed in a lattice pattern. In addition, the second coating layer 3Ac is not formed in an area of the groove G3 on the second surface 3ab.

A coating area of the second coating layer 3Ac in the area A2 is smaller than the coating area of the first coating layer 3b in the area A1 even in the submount 3A. As a result, it is possible to suppress deterioration of characteristics and reliability of the semiconductor laser device 4 to be mounted, which is similar to the case of the submount 3.

Referring to FIG. 5B, the submount 3B has a second coating layer 3Bc formed on the second surface 3ab of the substrate 3a. The second coating layer 3Bc has a thickness in a range of 20 μm to 200 μm and has the same thickness as the first coating layer 3b. The second coating layer 3Bc is formed of six coating layers 3Bca. Each of the coating layers 3Bca is made of a metal multilayer film containing Cu as a main component, which is the same as the first coating layer 3b. In addition, each of the coating layers 3Bca is separated from an adjacent one of the coating layers 3Bca by a corresponding one of grooves G4. Here, each of the coating layers 3Bca is a rectangle having a long side stretching in the longitudinal direction of the semiconductor laser device 4 when seen from a direction of the second surface side of the submount 3B, and each of the grooves G4 stretches along the longitudinal direction of the semiconductor laser device 4. As a result, the second coating layer 3Bc is formed in a striped pattern. In addition, the second coating layer 3Bc is not formed in an area of the groove G4 on the second surface 3ab.

A coating area of the second coating layer 3Bc in the area A2 is smaller than the coating area of the first coating layer 3b in the area A1 even in the submount 3B. As a result, it is possible to suppress deterioration of characteristics and reliability of the semiconductor laser device 4 to be mounted, which is similar to the case of the submount 3.

Referring to FIG. 5C, the submount 3C has a second coating layer 3Cc formed on the second surface 3ab of the substrate 3a. The second coating layer 3Cc has a thickness in a range of 20 μm to 200 μm and has the same thickness as the first coating layer 3b. The second coating layer 3Cc is formed of six coating layers 3Cca each of which has one or both side surfaces in a wavy shape. Each of the coating layers 3Cca is made of a metal multilayer film containing Cu as a main component, which is the same as the first coating layer 3b. In addition, each of the coating layers 3Cca is separated from an adjacent one of the coating layers 3Cca by a corresponding one of grooves G5. As a result, the second coating layer 3Cc is formed in a wavy-strip pattern. In addition, the second coating layer 3Cc is not formed in an area of the groove G5 on the second surface 3ab.

A coating area of the second coating layer 3Cc in the area A2 is smaller than the coating area of the first coating layer 3b in the area A1 even in the submount 3C. As a result, it is possible to suppress deterioration of characteristics and reliability of the semiconductor laser device 4 to be mounted, which is similar to the case of the submount 3.

Referring to FIG. 5D, the submount 3C' has a second coating layer 3C'c formed on the second surface 3ab of the substrate 3a. The second coating layer 3C'c has a thickness in a range of 20 μm to 200 μm and has the same thickness as the first coating layer 3b. The second coating layer 3C'c is formed of six coating layers 3C'ca each of which has one or both side surfaces in a wavy shape. Each of the coating layers 3C'ca is made of a metal multilayer film containing Cu as a main component, which is the same as the first coating layer 3b. In addition, each of the coating layers 3C'ca is separated from an adjacent one of the coating layers 3C'ca by a corresponding one of grooves G5'. As a result, the second coating layer 3C'c is formed in a wavy-strip pattern. In addition, the second coating layer 3C'c is not formed in an area of the groove G5' on the second surface 3ab.

A coating area of the second coating layer 3C'c in the area A2 is smaller than the coating area of the first coating layer 3b in the area A1 even in the submount 3C'. As a result, it is possible to suppress deterioration of characteristics and reliability of the semiconductor laser device 4 to be mounted, which is similar to the case of the submount 3.

Referring to FIG. 6A, the submount 3D has a second coating layer 3Dc formed on the second surface 3ab of the substrate 3a. The second coating layer 3Dc has a thickness in a range of 20 μm to 200 μm and has the same thickness as the first coating layer 3b. The second coating layer 3Dc is formed of seven coating layers 3Dca. Each of the coating layers 3Dca is made of a metal multilayer film containing Cu as a main component, which is the same as the first coating layer 3b. In addition, each of the coating layers 3Dca is separated from an adjacent one of the coating layers 3Dca by a corresponding one of grooves G6. Here, each of the coating layers 3Dca is a triangle or a trapezoid as seen from a direction of the second surface side of the submount 3D, and each of the grooves G6 stretches along a direction inclined with respect to the longitudinal direction of the semiconductor laser device 4. As a result, the second coating layer 3Dc is formed in an inclined-strip pattern. In addition, the second coating layer 3Dc is not formed in an area of the groove G6 on the second surface 3ab.

A coating area of the second coating layer 3Dc in the area A2 is smaller than the coating area of the first coating layer 3b in the area A1 even in the submount 3D. As a result, it is possible to suppress deterioration of characteristics and reliability of the semiconductor laser device 4 to be mounted, which is similar to the case of the submount 3.

Referring to FIG. 6B, the submount 3E has a second coating layer 3Ec formed on the second surface 3ab of the substrate 3a. The second coating layer 3Ec has a thickness in a range of 20 μm to 200 μm and has the same thickness as the first coating layer 3b. The second coating layer 3Ec is formed of twelve coating layers 3Eca. Each of the coating layers 3Eca is made of a metal multilayer film containing Cu as a main component, which is the same as the first coating layer 3b. In addition, each of the coating layers 3Eca is separated from an adjacent one of the coating layers 3Eca by a corresponding one of grooves G7. Here, each of the coating layers 3Eca is a triangle, a trapezoid, or a V shape as seen from a direction of the second surface side of the submount 3E. The second coating layer 3Ec is formed in a V-shaped strip pattern, and each of the grooves G7 is arranged such that an apex of the V shape is directed toward the longitudinal direction of the semiconductor laser device 4. In addition, the second coating layer 3Ec is not formed in an area of the groove G7 on the second surface 3ab.

A coating area of the second coating layer 3Ec in the area A2 is smaller than the coating area of the first coating layer 3b in the area A1 even in the submount 3E. As a result, it is possible to suppress deterioration of characteristics and reliability of the semiconductor laser device 4 to be mounted, which is similar to the case of the submount 3.

Incidentally, the pattern of the second coating layer in the submount is not limited to the above-described ones, and any pattern may be used as long as the pattern allows the coating area of the second coating layer in the area A2 to be smaller than the coating area of the first coating layer 3b in the area A1. For example, a lattice pattern formed of wavy lines or a lattice pattern formed of rhomboids may be used.

Next, a description will be given regarding simulation calculation results in the case of using a submount having the same configuration as the submount 3 according to the first embodiment illustrated in FIGS. 2A to 2C. Simulation calculation conditions are as follows. First, calculation was performed under a condition (condition A) that a chip-on-submount is formed by mounting a semiconductor laser device made of GaAs to a first coating layer on a first surface of a submount at a bonding temperature of about 300° C. The semiconductor laser device has a length of 4.5 mm and a thickness of 0.1 mm. The submount includes a substrate having a thickness of 0.7 mm and made of AlN, and the first coating layer and a second coating layer, which have the same thickness of 80 μm. The first coating layer has a coating area of 18.3 mm² and the second coating layer has a coating area of 16.2 mm². The first and second coating layer are made of Cu. Further, the calculation was performed under a condition (condition B) that this chip-on-submount is mounted on a metal plate made of Cu assuming one (base) obtained by mounting an LD height adjustment plate on a bottom plate of a package at a bonding temperature of about 150° C. A thickness of the metal plate was 3 mm.

Figure 7A:
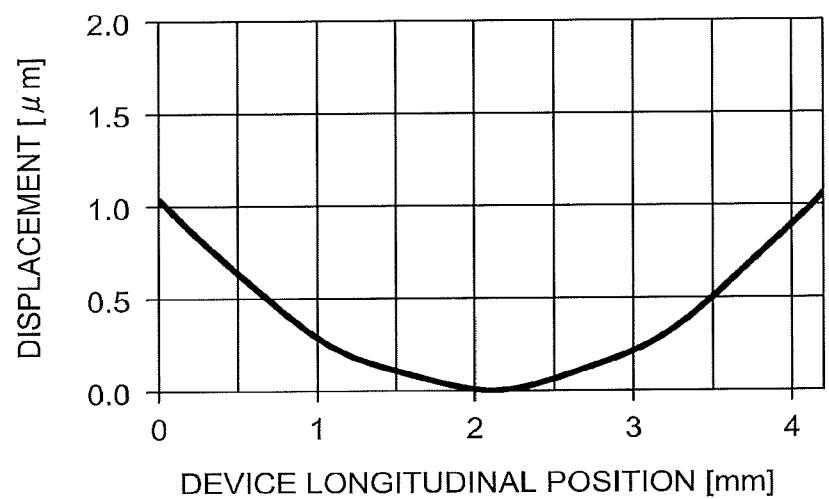
FIG. 7A is a graph illustrating a relationship between a longitudinal position and displacement of a semiconductor laser device in a simulation result in the case of using the submount according to the first embodiment.
Figure 7B:
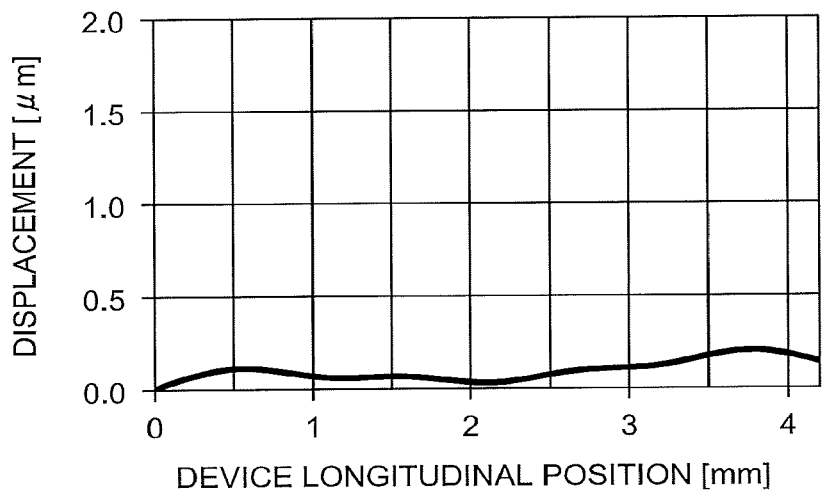
FIG. 7B is a graph illustrating a relationship between a longitudinal position and displacement of a semiconductor laser device in a simulation result in the case of using the submount according to the first embodiment.

FIGS. 7A and 7B are graphs illustrating a relationship between a longitudinal position and displacement of the semiconductor laser device in a simulation result in the case of using the submount having the same configuration as the submount 3 according to the first embodiment. FIG. 7A illustrates a result of the condition A, and FIG. 7B illustrates a result of the condition B.

As illustrated in FIGS. 7A and 7B, the semiconductor laser device warped convexly toward the submount side in the chip-on-submount in the case of the condition A, and a displacement amount thereof was 1 μm or more. However, in the case where it is assumed that the chip-on-submount is mounted on the base as in the case of the condition B, there was almost no warpage in the semiconductor laser device, and a displacement amount thereof was 0.3 μm or less.

Next, a simulation calculation result in the case of using a known submount will be described. Simulation calculation conditions are as follows. First, calculation was performed under the condition (condition A) that a chip-on-submount is formed by mounting a semiconductor laser device to a submount at a bonding temperature of about 300° C. The semiconductor laser device is made of GaAs having a length of 4.5 mm and a thickness of 0.1 mm. The submount includes a substrate having a thickness of 0.7 mm and made of AlN, and a first coating layer and a second coating layer, which have the same thickness of 55 μm. The first coating layer has a coating area of 18.3 mm² and the second coating layer has a coating area of 19.1 mm². The first and second coating layers are made of Cu. Here, a pattern such as the second coating layer 3c of the submount 3 was not formed on the second coating layer, and the coating area of the second coating layer was set to be larger than the coating area of the first coating layer. Further, the calculation was performed under a condition (condition B) that this chip-on-submount is mounted on a metal plate made of Cu assuming one (base) obtained by mounting an LD height adjustment plate on a bottom plate of a package at a bonding temperature of about 150° C. A thickness of the metal plate was 3 mm.

Figure 7C:
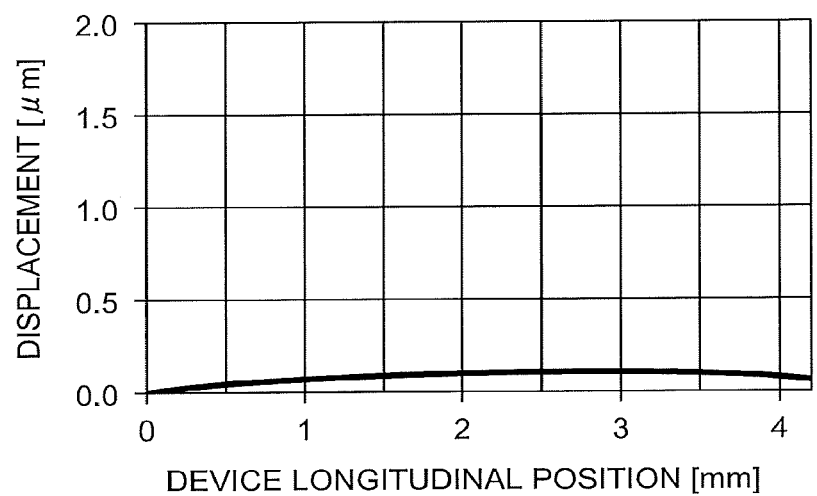
FIG. 7C is a graph illustrating a relationship between a longitudinal position and displacement of a semiconductor laser device in a simulation result in the case of using a known submount.
Figure 7D:
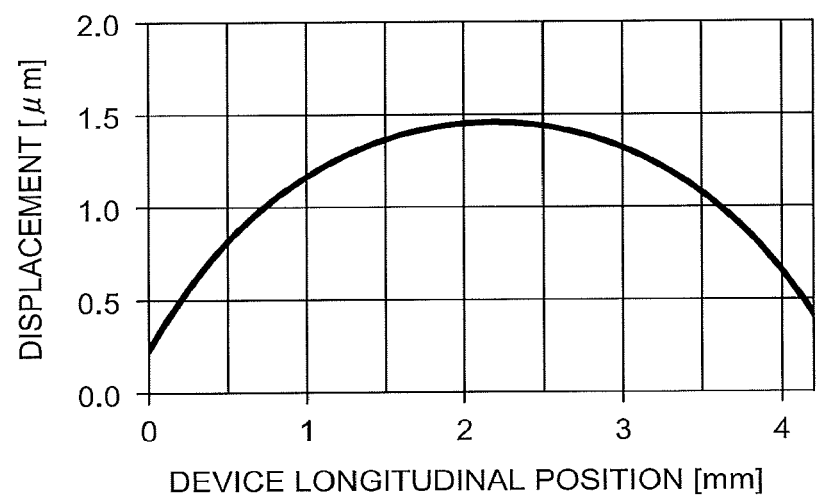
FIG. 7D is a graph illustrating a relationship between a longitudinal position and displacement of a semiconductor laser device in a simulation result in the case of using the known submount.

FIGS. 7C and 7D are graphs illustrating a relationship between a longitudinal position and displacement of a semiconductor laser device in a simulation result in the case of using the known submount. FIG. 7C illustrates a result of the condition A, and FIG. 7D illustrates a result of the condition B.

As illustrated in FIGS. 7C and 7D, there was almost no warpage of the semiconductor laser device in the chip-on-submount in the case of the condition A, but a large warpage that is convex toward the side opposite to the submount was generated in the semiconductor laser device, and a displacement amount thereof was about 1.5 μm when assuming the case of mounting the chip-on-submount on the base as in the case of the condition B.

From the above simulation results, it is understood that the warpage of the submount 3 and the thermal stress applied to the semiconductor laser device 4 are reduced when the chip-on-submount 16 is mounted on the semiconductor laser module 100, and it is possible to suppress the deterioration of the characteristics and reliability of the semiconductor laser device 4 according to the first embodiment of the present disclosure.

Second Embodiment

Next, other submounts according to second to fourth embodiments will be described. These submounts can be replaced with the submount 3 according to the first embodiment in the chip-on-submount 16 and the semiconductor laser module 100. Since the submounts according to the second to fourth embodiments are different from the submount 3 in terms of the configuration of the first or second coating layer, only the first or second coating layer will be described hereinafter.

Figure 8:
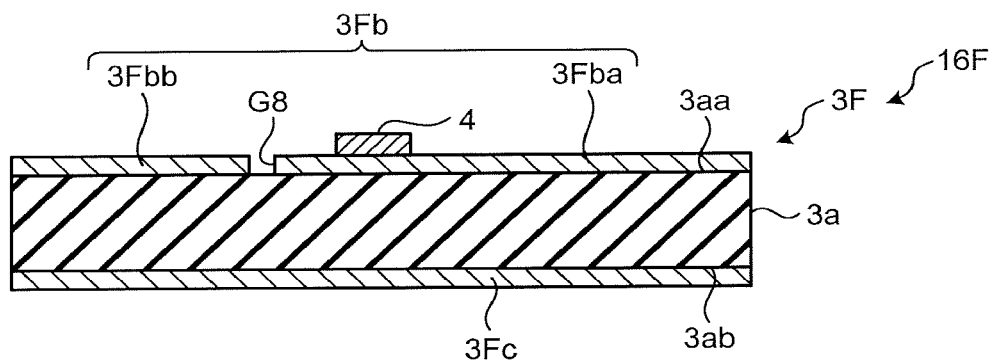
FIG. 8 is a schematic cross-sectional view of a chip-on-submount according to a second embodiment.

FIG. 8 is a schematic cross-sectional view of a chip-on-submount 16F according to the second embodiment. This cross-sectional view illustrates a cross section corresponding to one taken along a line orthogonal the line A-A of the chip-on-submount 16 illustrated in FIG. 2A.

In the chip-on-submount 16F illustrated in FIG. 8, both of a first coating layer 3Fb and a second coating layer 3Fc of a submount 3F are made of a metal multilayer film containing Cu as a main component, and have the same thickness in a range of 20 μm to 200 μm. Incidentally, the first coating layer 3Fb is formed of a coating layer 3Fba and a coating layer 3Fbb. The coating layer 3Fba and the coating layer 3Fbb are separated by a groove G8 for electrical insulation. In addition, the semiconductor laser device 4 is mounted on the coating layer 3Fba formed on the submount 3F using AuSn solder.

Here, the first coating layer 3Fb and the second coating layer 3Fc of the submount 3F are made of the same material and have the same thickness in the chip-on-submount 16F. However, a coating area of the second coating layer 3Fc in the area A2 is smaller than a coating area of the first coating layer 3Fb in the area A1. As a result, thermal stress applied to the semiconductor laser device 4 is reduced, and it is possible to suppress deterioration of characteristics and reliability of the semiconductor laser device 4, which is similar to each case of the above-described first embodiment and its modifications. Incidentally, it is possible to realize the coating area of the second coating layer 3Fc smaller than the coating area of the first coating layer 3Fb by forming the second coating layer 3Fc into the pattern of the second coating layer in any of the submounts according to the first embodiment and its modifications.

Third Embodiment

Figure 9:
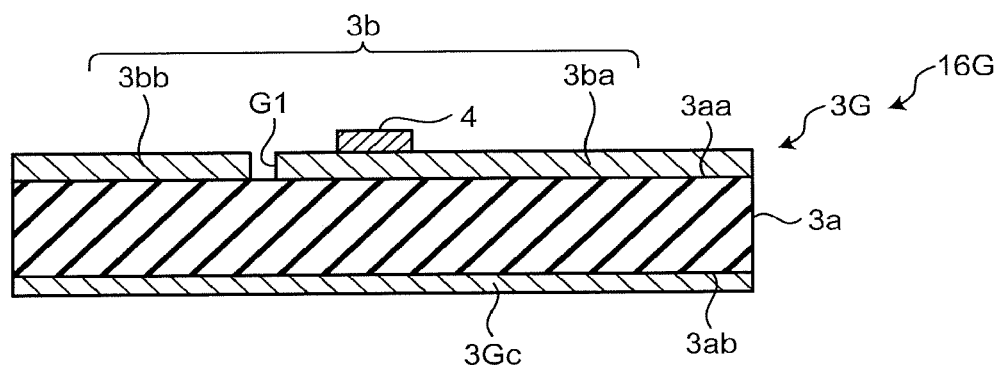
FIG. 9 is a schematic cross-sectional view of a chip-on-submount according to a third embodiment.

FIG. 9 is a schematic cross-sectional view of a chip-on-submount according to a third embodiment. This cross-sectional view illustrates a cross section corresponding to one taken along a line orthogonal to line A-A of the chip-on-submount 16 illustrated in FIG. 2B.

In the chip-on-submount 16G illustrated in FIG. 9, a submount 3G has a configuration in which the second coating layer 3c of the submount 3 is replaced by a second coating layer 3Gc. The second coating layer 3Gc is made of a metal multilayer film having Cu as a main component.

Here, the first coating layer 3b and the second coating layer 3Gc of the submount 3G are made of the same material in the chip-on-submount 16G. However, a thickness of the second coating layer 3Gc is smaller than a thickness of the first coating layer 3b. As a result, thermal stress applied to the semiconductor laser device 4 is reduced, and it is possible to suppress deterioration of characteristics and reliability of the semiconductor laser device 4, which is similar to each case of the above-described first embodiment including the modifications and second embodiment. In the submount 3G, it is preferable to increase a difference between the thickness of the first coating layer 3b and the thickness of the second coating layer 3Gc.

Next, results of simulation calculation performed for a submount with a first and second coating layers having different thicknesses will be described. Simulation calculation conditions are as follows. First, calculation was performed under the condition (condition A) that a chip-on-submount is formed by mounting a semiconductor laser device made of GaAs having a length of 4.5 mm and a thickness of 0.1 mm to the first coating layer on a first surface of a submount at a bonding temperature of about 300° C. The submount has a substrate having a thickness of 0.7 mm and made of AlN. The first coating layer and the second coating layer, which are made of Cu, have thicknesses of 55 μm and 20 μm, respectively, and coating areas of 18.3 mm² and 19.1 mm², respectively. Here, no patterns were formed in the second coating layer, and the coating area of the second coating layer was set to be larger than the coating area of the first coating layer. In addition, the second coating layer was thinner than the first coating layer. Further, the calculation was performed under a condition (condition B) that this chip-on-submount is mounted on a metal plate made of Cu assuming one (base) obtained by mounting an LD height adjustment plate on a bottom plate of a package at a bonding temperature of about 150° C. A thickness of the metal plate was 3 mm.

Figure 10A:
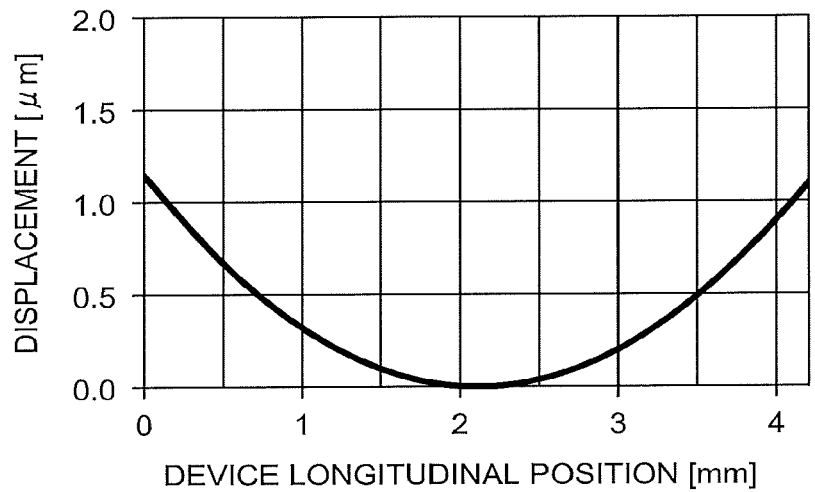
FIG. 10A is a graph illustrating a relationship between a longitudinal position and displacement of a semiconductor laser device in a simulation result in the case of using the submount according to the third embodiment.
Figure 10B:
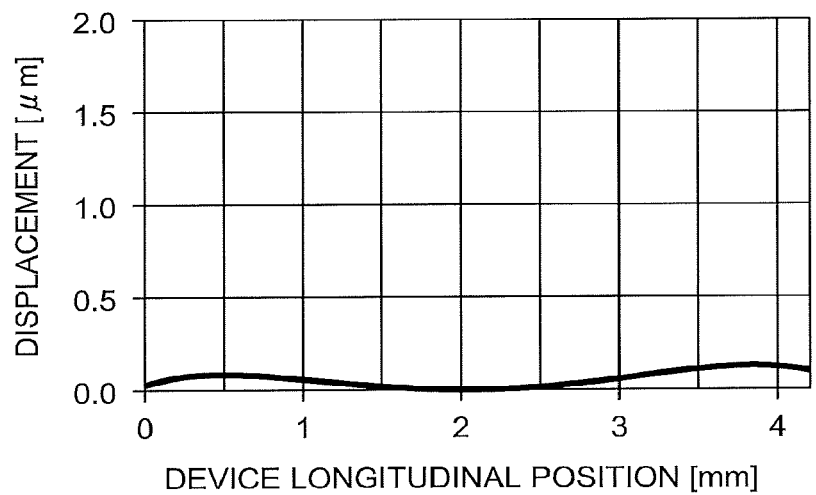
FIG. 10B is a graph illustrating a relationship between a longitudinal position and displacement of a semiconductor laser device in a simulation result in the case of using the submount according to the third embodiment.

FIGS. 10A and 10B are graphs illustrating the relationship between a longitudinal position and displacement of the semiconductor laser device in a simulation result in the case of using the submount in which the first coating layer and the second coating layer have different thicknesses. FIG. 10A illustrates a result of the condition A, and FIG. 10B illustrates a result of the condition B. As illustrated in FIG. 10A, the semiconductor laser device warped convexly toward the submount side in the chip-on-submount in the case of the condition A, and a displacement amount thereof was around 1.5 μm. However, in the case where it is assumed that the chip-on-submount is mounted on the base as in the case of the condition B, there was almost no warpage, and a displacement amount thereof was 0.15 μm or less.

From the above simulation results, it is understood that the warpage of the submount 3G and the thermal stress applied to the semiconductor laser device 4 are reduced when the chip-on-submount 16G is mounted on the semiconductor laser module 100. Therefore, it is possible to suppress the deterioration of the characteristics and reliability of the semiconductor laser device 4 according to the third embodiment.

Fourth Embodiment

Figure 11:
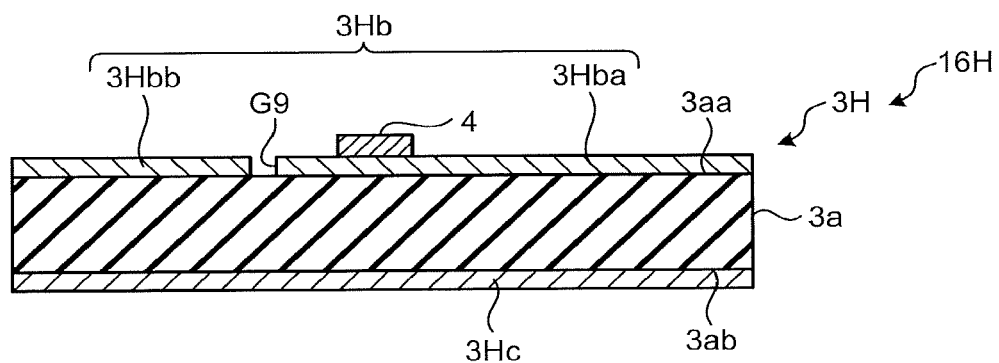
FIG. 11 is a schematic cross-sectional view of a chip-on-submount according to a fourth embodiment.

FIG. 11 is a schematic cross-sectional view of a chip-on-submount according to a fourth embodiment. This cross-sectional view illustrates a cross section corresponding to one illustrated in FIG. 9.

In the chip-on-submount 16H illustrated in FIG. 11, a first coating layer 3Hb on the substrate 3a of a submount 3H is made of Cu. In addition, a second coating layer 3Hc is made of Au. Here, a coefficient of linear expansion of Cu is $17 \times 10^{-6}$ (1/K), and a coefficient of linear expansion of Au is $14 \times 10^{-6}$ (1/K). Therefore, when a coefficient of thermal expansion of the second coating layer 3Hc is $CTE_2$ (1/K) and a coefficient of thermal expansion of the first coating layer 3Hb is $CTE_1$ (1/K), $CTE_2$ is smaller than $CTE_1$. In addition, the first coating layer 3Hb and the second coating layer 3Hc have the same thickness in a range of 20 μm to 200 μm. Incidentally, the first coating layer 3Hb is formed of a coating layer 3Hba and a coating layer 3Hbb. The coating layer 3Hba and the coating layer 3Hbb are separated by a groove G9 for electrical insulation. In addition, the semiconductor laser device 4 is mounted on the coating layer 3Hba of the submount 3H using AuSn solder.

Here, while the first coating layer 3Hb and the second coating layer 3Hc of the submount 3H have the same thickness in the chip-on-submount 16H, the coefficient of thermal expansion $CTE_2$ of the second coating layer 3Hc is smaller than the coefficient of thermal expansion $CTE_1$ of the first coating layer 3Hb. As a result, thermal stress applied to the semiconductor laser device 4 is reduced, and it is possible to suppress deterioration of characteristics and reliability of the semiconductor laser device 4, which is similar to each case of the above-described first and second embodiments.

As described above, the first coating layer and the second coating layer have the same coefficient of thermal expansion, and the above-described relationship concerning the coating areas is satisfied in the first and second embodiments. In the third embodiment, the first coating layer and the second coating layer have the same coefficient of thermal expansion, and the above-described relationship concerning the thickness is satisfied. In the fourth embodiment, the first coating layer and the second coating layer have the same thickness and the same coating area, and the above-described relationship concerning the coefficients of thermal expansion is satisfied.

In this manner, if at least one or two or more of the predetermined relationship (relationship A) concerning the coating areas, the predetermined relationship (relationship B) concerning the thicknesses, and the predetermined relationship (relationship C) concerning the coefficients of thermal expansion are satisfied between the first coating layer and the second coating layer of the submount, the thermal stress applied to the semiconductor laser device is reduced and the deterioration of characteristics and reliability of the semiconductor laser device can be suppressed when the semiconductor laser device is mounted on the submount to form the chip-on-submount and the chip-on-submount is mounted on the base made of metal. For example, the first embodiment corresponds to the case where the relationship A is satisfied.

In addition, if the submount is configured such that, without being limited to the above-described relationships, $CTE_1$ and $CTE_2$ are two or more times higher than $CTE_{sub}$ in the submount when the coefficient of thermal expansion of the second coating layer is $CTE_2$ (1/K), the coefficient of thermal expansion of the first coating layer is $CTE_1$ (1/K), and a coefficient of thermal expansion of the substrate is $CTE_{sub}$ (1/K), and a relationship (relationship D) of $$CTE_1 \times S_1 \times T_1 > CTE_2 \times S_2 \times T_2$$

is satisfied, where the coating area of the first coating layer in the area A1 is $S_1$, the thickness of the first coating layer is $T_1$ (μm), the coating area of the second coating layer in the area A2 is $S_2$, and the thickness of the second coating layer is $T_2$ (μm), the thermal stress applied to the semiconductor laser device is reduced, and the deterioration of the characteristics and reliability of the semiconductor laser device can be suppressed in the case of mounting the semiconductor laser device on this submount to form the chip-on-submount and mounting the chip-on-submount on the base made of metal.

Further, if at least one of the above-described relationships A, B, C, and D or a combination of two or more thereof is satisfied, the thermal stress applied to the semiconductor laser device is reduced and the deterioration of characteristics and reliability of the semiconductor laser device can be suppressed when the semiconductor laser device is mounted on the submount to form the chip-on-submount and the chip-on-submount is mounted on the base made of metal.

Incidentally, while the first coating layer and the second coating layer are configured as the metal layer in the above-described embodiments, the present disclosure is not limited thereto, and at least a part of the first coating layer and the second coating layer may be configured as the metal layer. That is, for example, the first coating layer or the second coating layer may have a multilayer structure including a metal layer which is a layer containing copper having a thickness of, for example, 20 μm to 200 μm. In addition, the first coating layer and the second coating layer may be made of Au.

Fifth Embodiment

Figure 12A:
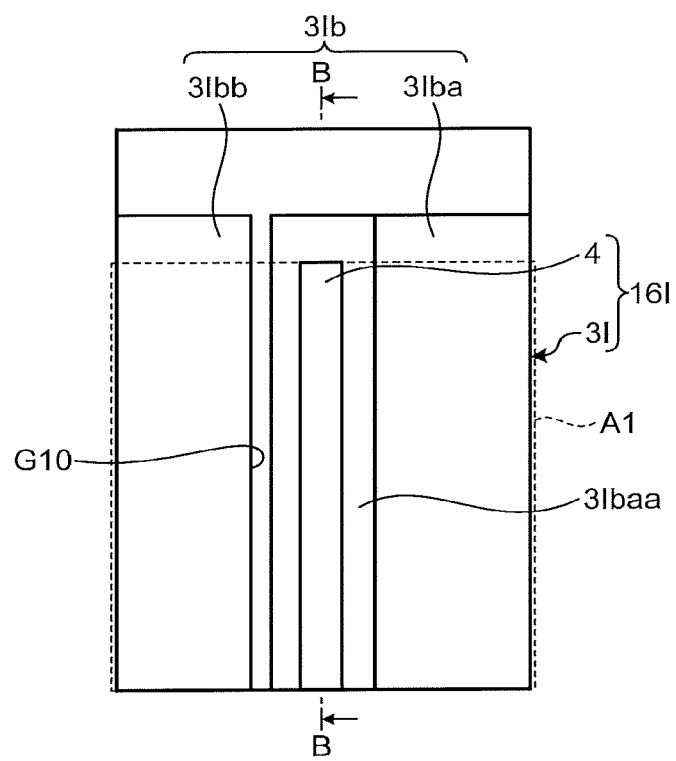
FIG. 12A is a schematic view of a chip-on-submount according to a fifth embodiment.
Figure 12B:
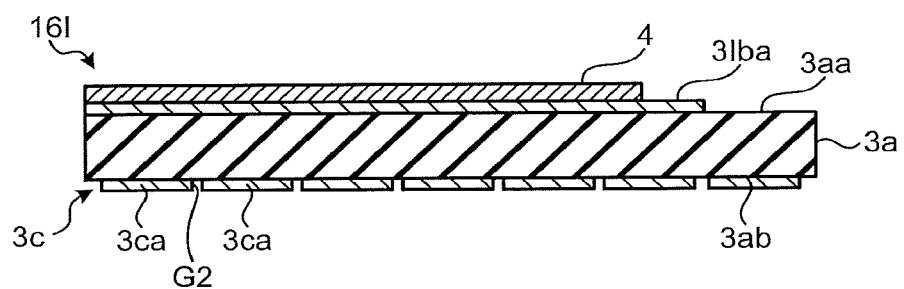
FIG. 12B is a schematic view of the chip-on-submount according to the fifth embodiment.
Figure 12C:
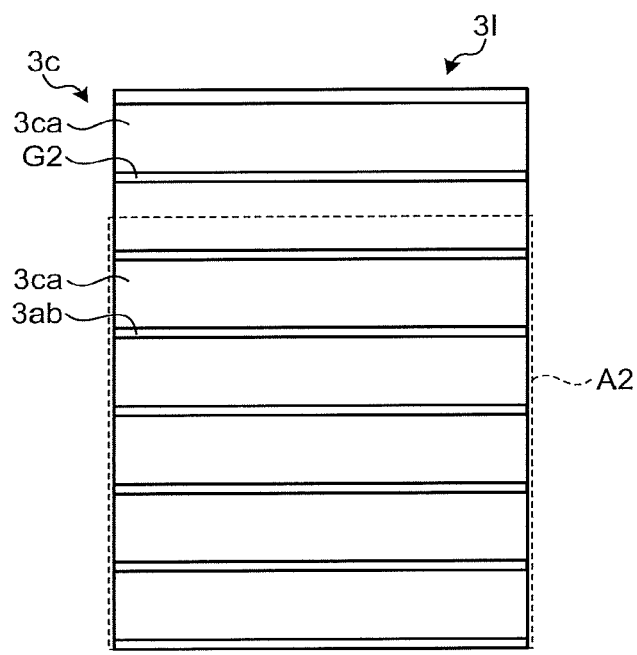
FIG. 12C is a schematic view of the chip-on-submount according to the fifth embodiment.

FIGS. 12A, 12B, and 12C are schematic views of a chip-on-submount according to a fifth embodiment. FIG. 12A is a view seen from a mounting surface side of the semiconductor laser device 4. FIG. 12B is a cross-sectional view taken along line B-B of FIG. 12A. FIG. 12C is a view seen from a side opposite to the mounting surface of the semiconductor laser device 4. A chip-on-submount 16I has a configuration in which the submount 3 of the chip-on-submount 16 according to the first embodiment is replaced by a submount 3I. The submount 3I has a configuration in which the first coating layer 3b of the submount 3 is replaced by a first coating layer 3Ib. The first coating layer 3Ib is formed of a coating layer 3Iba and a coating layer 3Ibb. The coating layer 3Iba and the coating layer 3Ibb are separated by a groove G10. A precoat 3Ibaa made of AuSn is formed on a surface of the coating layer 3Iba.

A coating area of the second coating layer 3c with respect to the second surface 3ab is larger than a coating area of the first coating layer 3Ib with respect to the first surface 3aa, but a coating area of the second coating layer 3c in the area A2 is smaller than a coating area of the first coating layer 3Ib in the area A1. As a result, the same effects as those of the first embodiment are achieved.

Although the semiconductor laser device 4 is mounted on the first coating layer of the first surface thereof to form the chip-on-submount in the submounts according to the above-described embodiments, the semiconductor laser device 4 may be mounted on a second coating layer of a second surface to form a chip-on-submount as in the following embodiments to be described below.

Sixth Embodiment

Figure 13A:
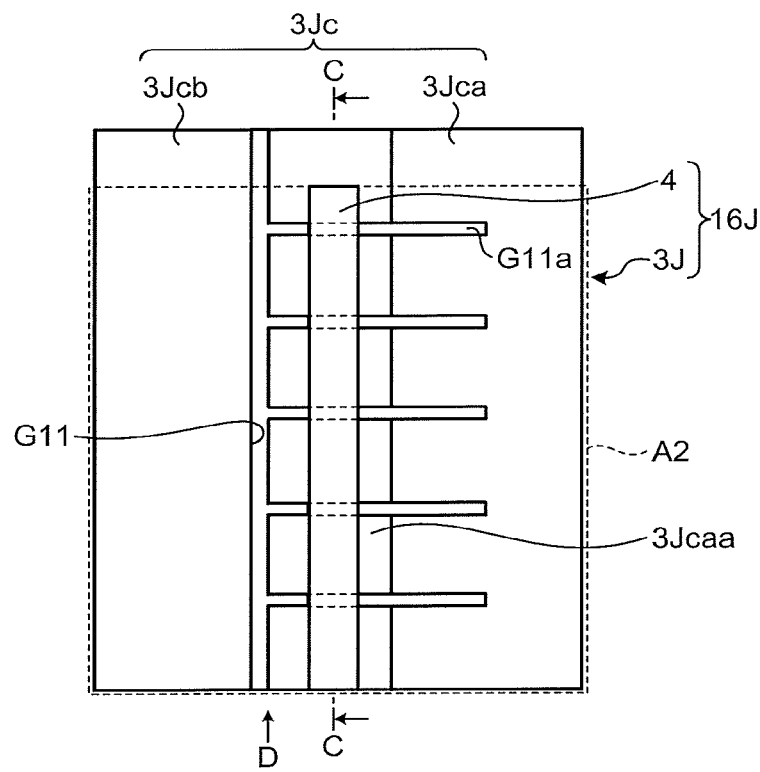
FIG. 13A is a schematic view of a chip-on-submount according to an sixth embodiment.
Figure 13B:
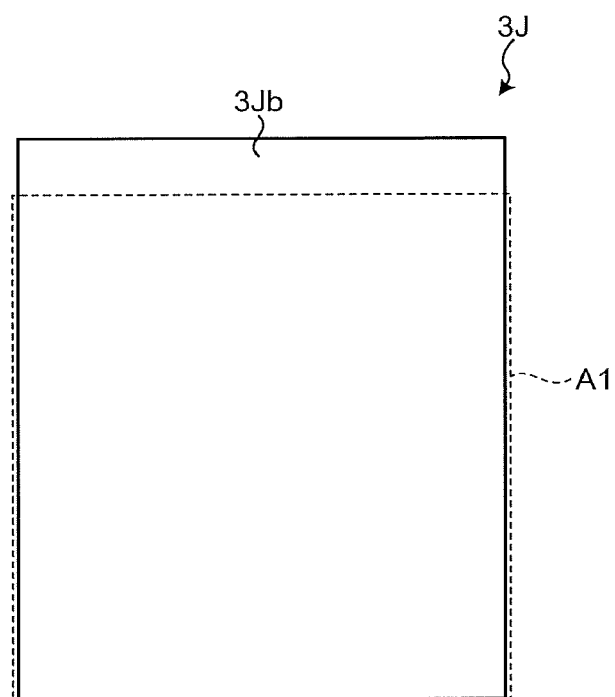
FIG. 13B is a schematic view of the chip-on-submount according to the sixth embodiment.
Figure 13C:
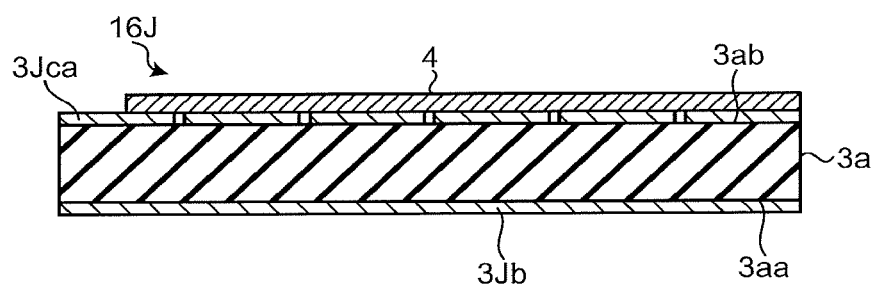
FIG. 13C is a schematic view of the chip-on-submount according to the sixth embodiment.
Figure 13D:
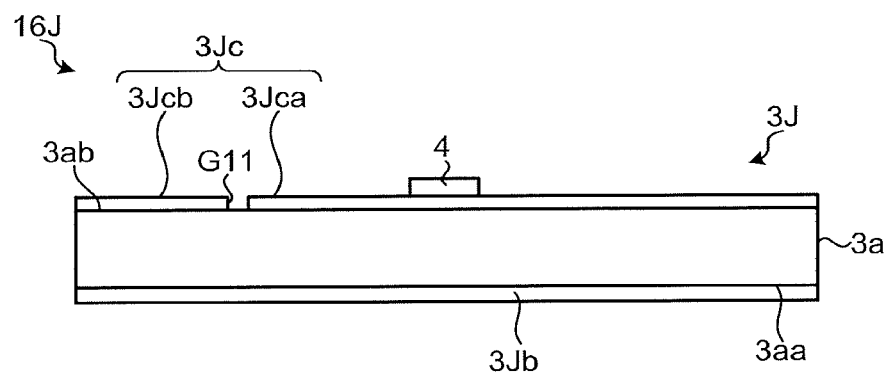
FIG. 13D is a schematic view of the chip-on-submount according to the sixth embodiment.

FIGS. 13A to 13D are schematic views of a chip-on-submount 16J according to a sixth embodiment. FIG. 13A is a view seen from a mounting surface side of the semiconductor laser device 4. FIG. 13B is a view seen from a side opposite to the mounting surface of the semiconductor laser device 4. FIG. 13C is a cross-sectional view taken along line C-C of FIG. 13A. FIG. 13D is a view seen from arrow D of FIG. 13A.

The chip-on-submount 16J includes a submount 3J and the semiconductor laser device 4 mounted on the submount 3J. The submount 3J includes the substrate 3a, a first coating layer 3Jb formed on the first surface 3aa of the substrate 3a, and a second coating layer 3Jc formed on the second surface 3ab of the substrate 3a.

Both the first coating layer 3Jb and the second coating layer 3Jc are made of a metal multilayer film containing Cu as a main component, and have the same thickness in a range of 20 μm to 200 μm. The second coating layer 3Jc is formed of a coating layer 3Jca and a coating layer 3Jcb. The coating layer 3Jca and the coating layer 3Jcb are separated by a groove G11 for electrical insulation.

A precoat 3Jcaa made of AuSn is formed on a surface of the coating layer 3Jca, and accordingly, it is easy to bond and mount the semiconductor laser device 4 to the coating layer 3Jca with the AuSn solder. In addition, the semiconductor laser device 4 is mounted in the area A2 in the second coating layer 3Jc.

In addition, a plurality of grooves G11a connected to the grooves G11 are formed in the coating layer 3Jca of the second coating layer 3Jc so as to be orthogonal to a stretching direction of the groove G11 and to pass below the semiconductor laser device 4. The second coating layer 3Jc is not formed in areas of the groove G11 and the groove G11a on the second surface 3ab of the substrate 3a. The grooves G11a are formed in such a pattern that a current can flow through the second coating layer 3Jc to the semiconductor laser device 4 and no electrically floating area is formed in the second coating layer 3Jc.

On the other hand, the first coating layer 3Jb is formed on the entire first surface 3aa of the substrate 3a. The area A1 is defined in the first coating layer 3Jb similarly to the other embodiments.

Here, the first coating layer 3Jb and the second coating layer 3Jc of the submount 3J are made of the same material and have the same thickness in the chip-on-submount 16J. However, a coating area of the second coating layer 3Jc in the area A2 is smaller than a coating area of the first coating layer 3Jb in the area A1. As a result, when the semiconductor laser device 4 initially has a large warpage, thermal stress applied to the semiconductor laser device 4 is reduced, and it is possible to suppress deterioration of characteristics and reliability of the semiconductor laser device 4.

Hereinafter, detailed descriptions will be given. FIGS. 14A to 14G are views for describing warpage of the semiconductor laser device 4 in an assembly process of a semiconductor laser module using the chip-on-submount 16J illustrated in FIGS. 13A to 13D.

Figure 14A:
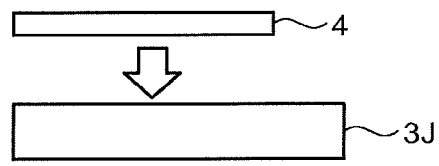
FIG. 14A is a view for describing warpage of a semiconductor laser device in an assembly process of a semiconductor laser module using the chip-on-submount illustrated in FIGS. 13A to 13D.
Figure 14B:
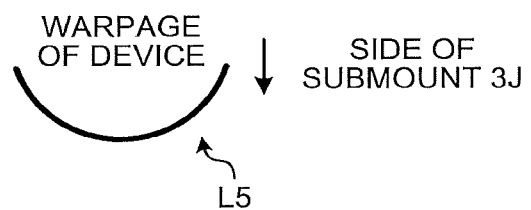
FIG. 14B is a view for describing warpage of the semiconductor laser device in the assembly process of the semiconductor laser module using the chip-on-submount illustrated in FIGS. 13A to 13D.
Figure 14C:
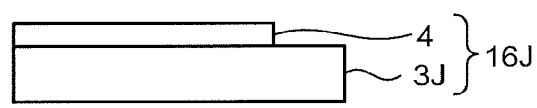
FIG. 14C is a view for describing warpage of the semiconductor laser device in the assembly process of the semiconductor laser module using the chip-on-submount illustrated in FIGS. 13A to 13D.
Figure 14D:
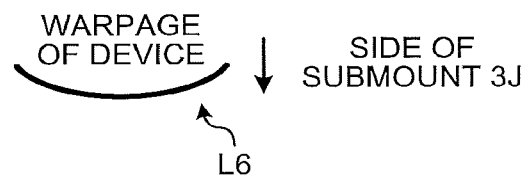
FIG. 14D is a view for describing warpage of the semiconductor laser device in the assembly process of the semiconductor laser module using the chip-on-submount illustrated in FIGS. 13A to 13D.

As described above, in the assembly process, the submount 3J is heated to a bonding temperature of about 300° C. Then, the semiconductor laser device 4 is mounted onto the second coating layer 3Jc of the submount 3J at the temperature using AuSn solder having a melting point of about 280° C. as illustrated in the side view of FIG. 14A. Here, it is assumed that the semiconductor laser device 4 initially warps to be greatly convex toward the submount 3J side as indicated by a line L5 in the longitudinal direction as illustrated in FIG. 14B. After the chip-on-submount 16J is formed as illustrated in FIG. 14C, when the temperature of the chip-on-submount 16J is lowered to room temperature, as illustrated in FIG. 14D, warpage of convex toward the submount 3J side is relieved as indicated by a line L6 in the longitudinal direction of the semiconductor laser device 4. A reason thereof is as follows. That is, the coating area of the second coating layer 3Jc in the area A2 is smaller than the coating area of the first coating layer 3Jb in the area A1 in the submount 3J. Thus, when the temperature is lowered from the bonding temperature to room temperature, the first coating layer 3Jb applies thermal stress, which makes particularly the substrate 3a contract in the longitudinal direction (the lateral direction of the paper), with a larger degree than that of the second coating layer 3Jc, and thus, a force to warp convexly toward the semiconductor laser device 4 side in the longitudinal direction is generated in the entire submount 3J. Accordingly, the warpage of the semiconductor laser device 4 to be convex toward the submount 3J side is relieved.

Figure 14E:
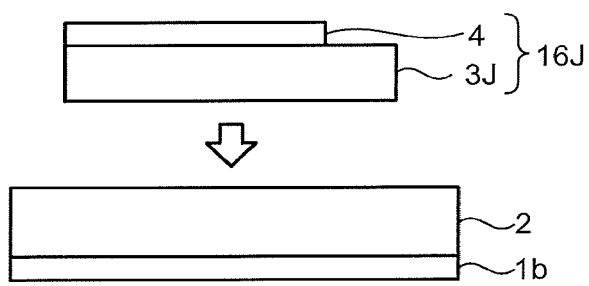
FIG. 14E is a view for describing warpage of the semiconductor laser device in the assembly process of the semiconductor laser module using the chip-on-submount illustrated in FIGS. 13A to 13D.
Figure 14F:
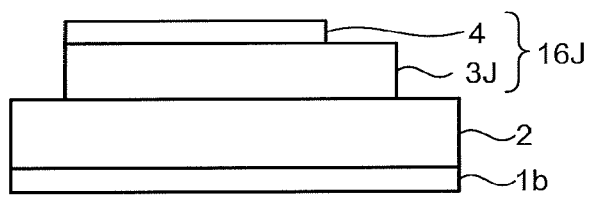
FIG. 14F is a view for describing warpage of the semiconductor laser device in the assembly process of the semiconductor laser module using the chip-on-submount illustrated in FIGS. 13A to 13D.
Figure 14G:
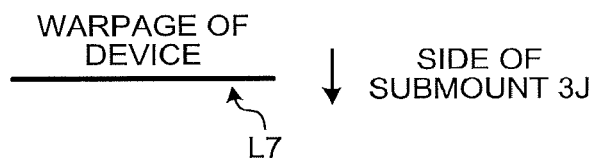
FIG. 14G is a view for describing warpage of the semiconductor laser device in the assembly process of the semiconductor laser module using the chip-on-submount illustrated in FIGS. 13A to 13D.

Next, the bottom plate 1b of the package 1 on which the LD height adjustment plate 2 has been mounted is heated to a bonding temperature of about 150° C. Then, each of the chip-on-submounts 16J is mounted onto the LD height adjustment plate 2 at the temperature using the SnBi solder having the melting point of about 140° C. as illustrated in FIG. 14E, thereby forming a state illustrated in FIG. 14F. When the temperature of the bottom plate 1b of the package 1 is lowered to room temperature, the warpage of the semiconductor laser device 4 is substantially eliminated as indicated by a line L7 in FIG. 14G. A reason thereof is as follows. That is, since the substrate 3a of the submount 3J has the smaller coefficient of thermal expansion than those of the LD height adjustment plate 2 and the bottom plate 1b of the package 1, the LD height adjustment plate 2 and the bottom plate 1b of the package 1 apply the thermal stress, which causes the warpage convexly toward the semiconductor laser device 4 side, to the submount 3J when the temperature is lowered from the bonding temperature to room temperature. Thus, the warpage of the submount 3J to be convex to the side opposite to the semiconductor laser device 4 in the state of FIG. 14C is reduced or canceled, and the warpage of the semiconductor laser device 4 is substantially eliminated.

Incidentally, each coating area of the second coating layer 3Jc and the first coating layer 3Jb and each thickness of the second coating layer 3Jc and the first coating layer 3Jb may be set such that the warpage of the semiconductor laser device 4 is substantially eliminated in consideration of the bonding temperature in each mounting process, the constituent material and the initial warpage of the semiconductor laser device 4, the constituent material of the submount 3J, each coefficient of thermal expansion and each thickness of the LD height adjustment plate 2 and the bottom plate 1b of the package 1, and the like.

Seventh and Eighth Embodiments

Figure 15:
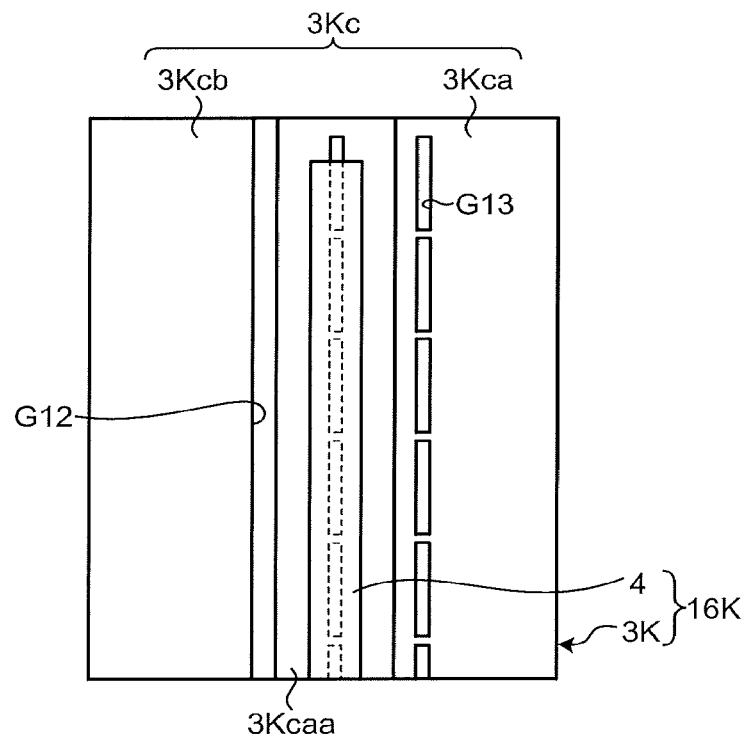
FIG. 15 is a schematic view of a chip-on-submount according to a seventh embodiment.
Figure 16:
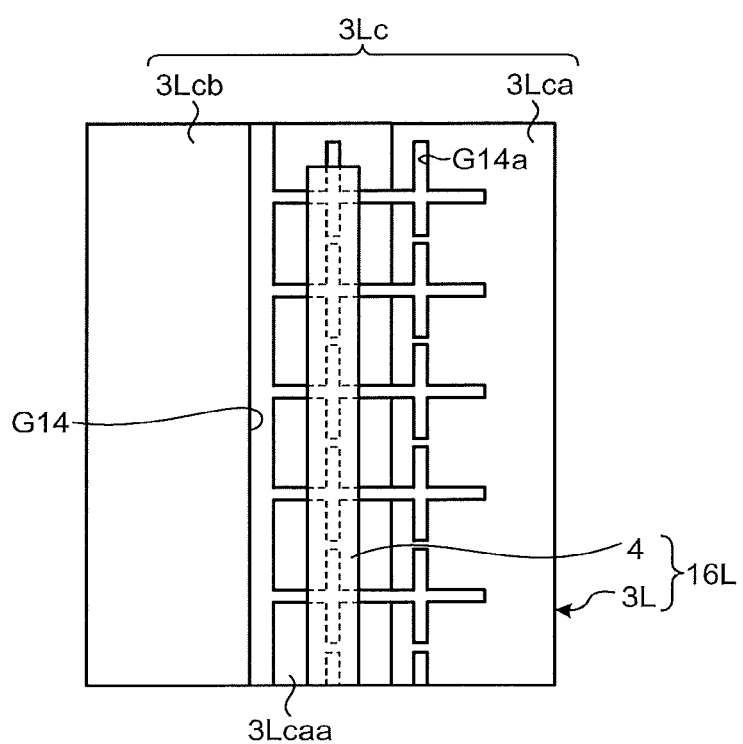
FIG. 16 is a schematic view of a chip-on-submount according to an eighth embodiment.

Next, chip-on-submounts according to seventh and eighth embodiments will be described with reference to FIGS. 15 and 16, respectively. FIG. 15 is a view of a chip-on-submount 16K according to the seventh embodiment as seen from a mounting surface side of the semiconductor laser device 4. FIG. 16 is a view of a chip-on-submount 16L according to the eighth embodiment as seen from a mounting surface side of the semiconductor laser device 4.

The chip-on-submount 16K includes a submount 3K and the semiconductor laser device 4 mounted on the submount 3K. The chip-on-submount 16L includes a submount 3L and the semiconductor laser device 4 mounted on the submount 3L. Since only the pattern and the coating area of the second coating layer are different between the submount 3J of the chip-on-submount 16J (FIG. 13A) and the submounts 3K and 3L, only the pattern and the coating area of the second coating layer will be described hereinafter.

The submount 3K has a second coating layer 3Kc formed on the second surface 3ab of the substrate 3a as illustrated in FIG. 15. The second coating layer 3Kc has a thickness in a range of 20 μm to 200 μm, and has the same thickness as the first coating layer 3Jb. The second coating layer 3Kc is formed of a coating layer 3Kca and a coating layer 3Kcb. The coating layer 3Kca and the coating layer 3Kcb are separated by a groove G12 for electrical insulation. A precoat 3Kcaa is formed on a surface of the coating layer 3Kca. In addition, the semiconductor laser device 4 is mounted on the second coating layer 3Kc.

In addition, a plurality of grooves G13 are formed in the coating layer 3Kca of the second coating layer 3Kc to be arranged in two rows. In each row, the grooves G13G are disposed in series in a stretching direction of the groove G12. The two rows are in parallel with each other. One of the rows of the grooves 13G is formed below the semiconductor laser device 4 as partially indicated by broken lines, and the other of the rows of groove 13G is formed in an area where the precoat 3Kcaa is not formed. The second coating layer 3Kc is not formed in areas of the groove G12 and the groove G13 on the second surface 3ab of the substrate 3a. The grooves G13 are formed in such a pattern that a current can flow through the second coating layer 3Kc to the semiconductor laser device 4 and no electrically floating area is formed in the second coating layer 3Kc.

A coating area of the second coating layer 3Kc in the area A2 is smaller than the coating area of the first coating layer 3Jb in the area A1 even in the submount 3K. As a result, when the semiconductor laser device 4 initially has a large warpage, it is possible to suppress deterioration of characteristics and reliability of the semiconductor laser device 4 to be mounted, which is similar to the case of the submount 3J.

As illustrated in FIG. 16, the submount 3L has a second coating layer 3Lc formed on the second surface 3ab of the substrate 3a. The second coating layer 3Lc has a thickness in a range of 20 μm to 200 μm, and has the same thickness as the first coating layer 3Jb. The second coating layer 3Lc is formed of a coating layer 3Lca and a coating layer 3Lcb. The coating layer 3Lca and the coating layer 3Lcb are separated by a groove G14 for electrical insulation. A precoat 3Lcaa is formed on a surface of the coating layer 3Lca. In addition, the semiconductor laser device 4 is mounted on the second coating layer 3Lc.

In addition, a groove G14a is formed in the coating layer 3Lca of the second coating layer 3Lc. The groove G14a has a shape of combination of the groove G11a illustrated in FIG. 13A and the groove G13 illustrated in FIG. 15. The second coating layer 3Lc is not formed in areas of the groove G14 and the groove G14a on the second surface 3ab of the substrate 3a. The groove G14a are formed in such a pattern that a current can flow through the second coating layer 3Lc to the semiconductor laser device 4 and no electrically floating area is formed in the second coating layer 3Lc.

A coating area of the second coating layer 3Lc in the area A2 is smaller than the coating area of the first coating layer 3Jb in the area A1 even in the submount 3L. As a result, when the semiconductor laser device 4 initially has a large warpage, it is possible to suppress deterioration of characteristics and reliability of the semiconductor laser device 4 to be mounted, which is similar to the case of the submount 3J.

Ninth Embodiment

Figure 17:
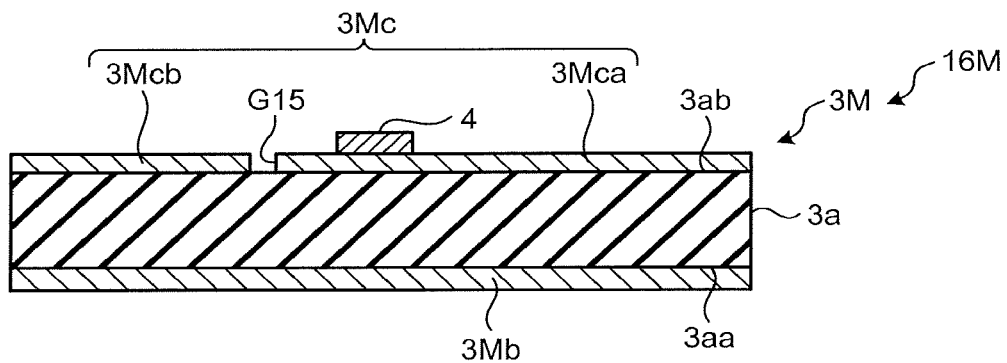
FIG. 17 is a schematic cross-sectional view of a chip-on-submount according to a ninth embodiment.

FIG. 17 is a schematic cross-sectional view of a chip-on-submount according to a ninth embodiment. This cross-sectional view illustrates a cross section, which corresponds to a plane orthogonal to a cross section taken along line C-C of the chip-on-submount illustrated in FIG. 13A, of a chip-on-submount 16M according to the ninth embodiment.

In the chip-on-submount 16M illustrated in FIG. 17, a first coating layer 3Mb and a second coating layer 3Mc are made of a metal multilayer film containing Cu as a main component. The second coating layer 3Mc is formed of a coating layer 3Mca and a coating layer 3Mcb. The coating layer 3Mca and the coating layer 3Mcb are separated by a groove G15 for electrical insulation. In addition, the semiconductor laser device 4 is mounted onto a submount 3M via the coating layer 3Mca.

In the chip-on-submount 16M, the first coating layer 3Mb and the second coating layer 3Mc of the submount 3M are made of the same material. However, a thickness of the second coating layer 3Mc is smaller than a thickness of the first coating layer 3Mb. As a result, when the semiconductor laser device 4 initially has a large warpage, it is possible to suppress deterioration of characteristics and reliability of the semiconductor laser device 4 to be mounted, which is similar to each case of the above-described sixth to eighth embodiments. In the submount 3M, it is preferable to increase a difference between the thickness of the first coating layer 3Mb and the thickness of the second coating layer 3Mc.

Tenth Embodiment

Figure 18:
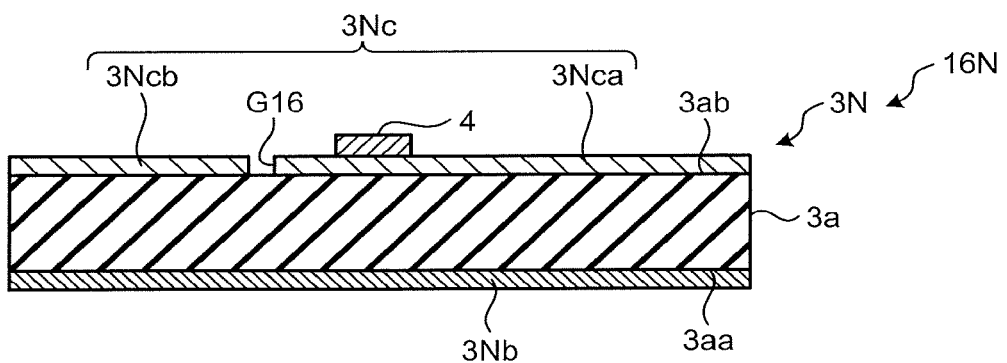
FIG. 18 is a schematic cross-sectional view of a chip-on-submount according to a tenth embodiment.

FIG. 18 is a schematic cross-sectional view of a chip-on-submount according to a tenth embodiment. This cross-sectional view illustrates a cross section, which corresponds to the cross section of the chip-on-submount 16M illustrated in FIG. 17, of a chip-on-submount 16N according to the tenth embodiment.

In the chip-on-submount 16N illustrated in FIG. 18, a first coating layer 3Nb on the substrate 3a of a submount 3N is made of Cu. In addition, a second coating layer 3Nc is made of Au. Here, a coefficient of linear expansion of Cu is $17 \times 10^{-6}$ (1/K), and a coefficient of linear expansion of Au is $14 \times 10^{-6}$ (1/K). Therefore, when a coefficient of thermal expansion of the second coating layer 3Nc is $CTE_2$ (1/K) and a coefficient of thermal expansion of the first coating layer 3Nb is $CTE_1$ (1/K), $CTE_2$ is smaller than $CTE_1$. In addition, the first coating layer 3Nb and the second coating layer 3Nc have the same thickness in a range of 20 μm to 200 μm. Incidentally, the second coating layer 3Nc is formed of a coating layer 3Nca and a coating layer 3Ncb. The coating layer 3Nca and the coating layer 3Ncb are separated by a groove G16 for electrical insulation. In addition, the semiconductor laser device 4 is mounted onto the submount 3N via the coating layer 3Nca.

In the chip-on-submount 16N, the first coating layer 3Nb and the second coating layer 3Nc of the submount 3N have the same thickness. However, the coefficient of thermal expansion $CTE_2$ of the second coating layer 3Nc is smaller than the coefficient of thermal expansion $CTE_1$ of the first coating layer 3Nb. As a result, when the semiconductor laser device 4 initially has a large warpage, thermal stress applied to the semiconductor laser device 4 to be mounted is reduced, and it is possible to suppress deterioration of characteristics and reliability of the semiconductor laser device 4, which is similar to each case of the above-described sixth to ninth embodiments.

Even in the case where the semiconductor laser device 4 is mounted on the second coating layer, if at least one or two or more of the above-described relationships A, B, C, and D are satisfied between the first coating layer and the second coating layer of the submount as in the sixth to tenth embodiments, the thermal stress applied to the semiconductor laser device is reduced and the deterioration of characteristics and reliability of the semiconductor laser device can be suppressed when the semiconductor laser device initially having the large warpage is mounted on the submount to form the chip-on-submount and the chip-on-submount is mounted on the base made of metal.

Figure 19:
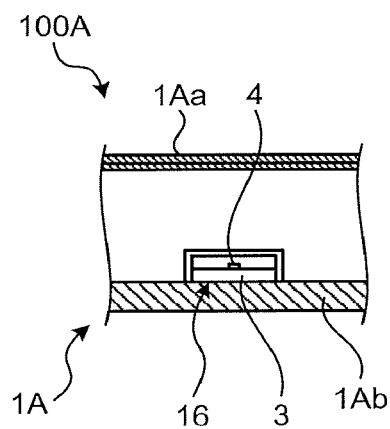
FIG. 19 is a view illustrating the semiconductor laser module including the chip-on-submount according to the first embodiment.

In addition, the chip-on-submount 16 is mounted on the bottom plate 1b of the package 1 via the LD height adjustment plate 2 serving as the base in the semiconductor laser module 100 illustrated in FIG. 1, but the present disclosure is not limited thereto. For example, as illustrated in FIG. 19, the chip-on-submount 16 is directly mounted onto a bottom plate 1Ab of a package 1A made of metal and having a lid 1Aa in the case of a semiconductor laser module 100A having only the single chip-on-submount 16 obtained by mounting the semiconductor laser device 4 on the submount 3. In this case, the bottom plate 1Ab corresponds to the base.

In addition, the description has been given in the above-described embodiments regarding the case where the semiconductor device to be mounted is the semiconductor laser device. However, the type of the semiconductor device is not particularly limited, and may be a semiconductor laser device, a photodiode, a semiconductor optical amplifier, a semiconductor optical modulator, or an integrated semiconductor device in which two or more of these are integrated.

In addition, the present disclosure is not limited by the above-described embodiments. The present disclosure encompasses those configured by appropriately combining the respective constituent elements described above. In addition, additional effects and modified examples can be easily derived by those skilled in the art. Accordingly, broader aspects of the present disclosure are not limited to the above-described embodiments, and various modifications can be made.

According to the present disclosure, the warpage of the submount and the thermal stress applied to the device are reduced, and an effect that it is possible to suppress the deterioration of characteristics and reliability of the semiconductor device is achieved.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A submount on which a semiconductor device is mounted and which is mounted on a base made of metal, the submount comprising:
   a substrate;
   a first coating layer formed on a first surface of the substrate and made of a material having a higher coefficient of thermal expansion than that of the substrate; and
   a second coating layer formed on a second surface opposing to the first surface of the substrate and made of a material having a higher coefficient of thermal expansion than that of the substrate,
   wherein the semiconductor device is bonded to the first coating layer to define a first area on the first coating layer and a second area on the second coating layer,
   the first area being an area included in the first surface, a length of the first area in a longitudinal direction of the first area being equal to a length of the semiconductor device in a longitudinal direction of the semiconductor device, the second area being an area included in the second surface where the first area is projected on the second surface such that the second area corresponds to the first area, and
   wherein a coating area of the second coating layer within the second area is smaller than a coating area of the first coating layer within the first area.

2. The submount according to claim 1, wherein a thickness of the second coating layer is smaller than a thickness of the first coating layer.

3. The submount according to claim 1, wherein when a coefficient of thermal expansion of the second coating layer is $CTE_2$ (1/K) and a coefficient of thermal expansion of the first coating layer is $CTE_1$ (1/K), $CTE_2$ is smaller than $CTE_1$.

4. The submount according to claim 1, wherein
   when the coefficient of thermal expansion of the second coating layer is $CTE_2$ (1/K), the coefficient of thermal expansion of the first coating layer is $CTE_1$ (1/K), and a coefficient of thermal expansion of the substrate is $CTE_{sub}$ (1/K), $CTE_1$ and $CTE_2$ are two or more times higher than $CTE_{sub}$, and when the coating area of the first coating layer is $S_1$, the thickness of the first coating layer is $T_1$, the coating area of the second coating layer is $S_2$, and the thickness of the second coating layer is $T_2$, a relationship of $$CTE_1 \times S_1 \times T_1 > CTE_2 \times S_2 \times T_2$$

is satisfied.

5. The submount according to claim 1, wherein the second coating layer is formed in a lattice or striped pattern.

6. The submount according to claim 1, wherein the substrate contains at least one of aluminum nitride, alumina, beryllia, boron nitride, diamond, silicon carbide, silicon nitride, silicon dioxide, and zirconia.

7. The submount according to claim 1, wherein at least a part of the first coating layer and the second coating layer is configured as a metal layer.

8. The submount according to claim 7, wherein at least a part of the metal layer is configured as a layer containing copper having a thickness of 20 μm to 200 μm.

9. A submount on which a semiconductor device is mounted and which is mounted on a base made of metal, the submount comprising:
   a substrate;
   a first coating layer formed on a first surface of the substrate and made of a material having a higher coefficient of thermal expansion than that of the substrate; and
   a second coating layer formed on a second surface, positioned on a side opposite to the first surface, of the substrate and made of a material having a higher coefficient of thermal expansion than that of the substrate,
   wherein the semiconductor device is bonded to the first coating layer and $CTE_1$ and $CTE_2$ are two or more times higher than $CTE_{sub}$ when a coefficient of thermal expansion of the second coating layer is $CTE_2$ (1/K), a coefficient of thermal expansion of the first coating layer is $CTE_1$ (1/K), and a coefficient of thermal expansion of the substrate is $CTE_{sub}$ (1/K), and
   when a coating area of the first coating layer is $S_1$, a thickness of the first coating layer is $T_1$, a coating area of the second coating layer is $S_2$, and a thickness of the second coating layer is $T_2$, a relationship of $$CTE_1 \times S_1 \times T_1 > CTE_2 \times S_2 \times T_2$$

is satisfied, wherein the second coating layer is formed in a lattice or striped pattern.

10. The submount according to claim 9, wherein the substrate contains at least one of aluminum nitride, alumina, beryllia, boron nitride, diamond, silicon carbide, silicon nitride, silicon dioxide, and zirconia.

11. The submount according to claim 9, wherein at least a part of the first coating layer and the second coating layer is configured as a metal layer.

12. The submount according to claim 11, wherein at least a part of the metal layer is configured as a layer containing copper having a thickness of 20 μm to 200 μm.

13. A semiconductor device mounting submount comprising the submount according to claim 1.

14. The semiconductor device mounting submount according to claim 13, wherein a main material of the semiconductor device is gallium arsenide or indium phosphide.

15. A semiconductor device mounting submount comprising the submount according to claim 9.

16. The semiconductor device mounting submount according to claim 15, wherein a main material of the semiconductor device is gallium arsenide or indium phosphide.

17. A semiconductor device module comprising:
the semiconductor device mounting submount according to claim 13;
a package that accommodates the semiconductor device mounting submount; and
the base made of metal and on which the semiconductor device mounting submount is mounted.

18. The semiconductor device module according to claim 17, wherein the base constitutes a bottom plate of the package.

19. A semiconductor device module comprising:
the semiconductor device mounting submount according to claim 15;
a package that accommodates the semiconductor device mounting submount; and
the base made of metal and on which the semiconductor device mounting submount is mounted.

20. The semiconductor device module according to claim 19, wherein the base constitutes a bottom plate of the package.

* * * * *